United States Patent
Abe et al.

(10) Patent No.: US 6,369,688 B1
(45) Date of Patent: Apr. 9, 2002

(54) AUTOMATIC GANG SWITCH HAVING A HEAT RAY SENSOR

(75) Inventors: Tatsuya Abe; Masaharu Fukushima; Shiro Mori; Takahiro Yamanouchi; Hirotoshi Watanabe, all of Tsu; Makoto Morimoto, Ikoma; Hideki Kawahara, Katano, all of (JP)

(73) Assignee: Matsushita Electric Works, Ltd., Kadomi (JP)

( * ) Notice: Subject to any disclaimer, the term of this patent is extended or adjusted under 35 U.S.C. 154(b) by 0 days.

(21) Appl. No.: 09/584,139

(22) Filed: May 31, 2000

(30) Foreign Application Priority Data

Jun. 15, 1999 (JP) .......................................... 11-168986

(51) Int. Cl.[7] .................... H01H 37/32; H01H 37/02; H01H 47/24; G08B 13/18
(52) U.S. Cl. ..................... 337/299; 337/298; 361/173; 307/117; 340/567
(58) Field of Search ............................ 337/2, 12, 298, 337/299; 200/61.02; 307/116, 117; 361/173, 174, 175, 211; 340/500, 541, 552, 555, 567

(56) References Cited

U.S. PATENT DOCUMENTS

| | | | | |
|---|---|---|---|---|
| 4,433,718 A | * | 2/1984 | Bresin .......................... | 165/12 |
| 5,434,378 A | * | 7/1995 | McLean ....................... | 200/537 |
| 5,473,202 A | * | 12/1995 | Mudge et al. ............... | 307/116 |
| 6,304,180 B1 | * | 10/2001 | Platner et al. ............... | 340/567 |

FOREIGN PATENT DOCUMENTS

| | | | | |
|---|---|---|---|---|
| JP | 3-216797 | * | 9/1991 | ............ G08B/5/36 |
| JP | 9-106706 | * | 4/1997 | ........... F21V/23/00 |

* cited by examiner

Primary Examiner—Leo P. Picard
Assistant Examiner—Anatoly Vortman
(74) Attorney, Agent, or Firm—Oblon, Spivak, McClelland, Maier & Neustadt, P.C.

(57) ABSTRACT

The automatic gang switch having a heat ray sensor is fixedly mounted on a mounting frame having a generally rectangular opening. The length of a housing of the switch is approximately two thirds of that of the generally rectangular opening of the mounting frame, while the width of the housing is approximately equal to that of the generally rectangular opening of the mounting frame. The switch includes a human body detecting section for detecting heat rays emitted from a human body and a circuit section. The circuit section includes a control circuit for generating a control signal to turn a load on for a predetermined operation holding time when the human body detecting section generates a detection signal, a load control circuit connected to a power source and the load in series for turning on or off power supply to the load depending on the control signal, an off-time power circuit connected in parallel with the load control circuit and having an input impedance with which the load is not driven when the load control circuit is off, the off-time power circuit supplying an electric power to the control circuit when the load control circuit is off, and an on-time power circuit for supplying the electric power to the control circuit when the load control circuit is on. The switch further includes a time setting section for setting an operation holding time and a mode setting section for changing over an operation mode of the control circuit.

19 Claims, 27 Drawing Sheets

Fig. 25A
Fig. 25B
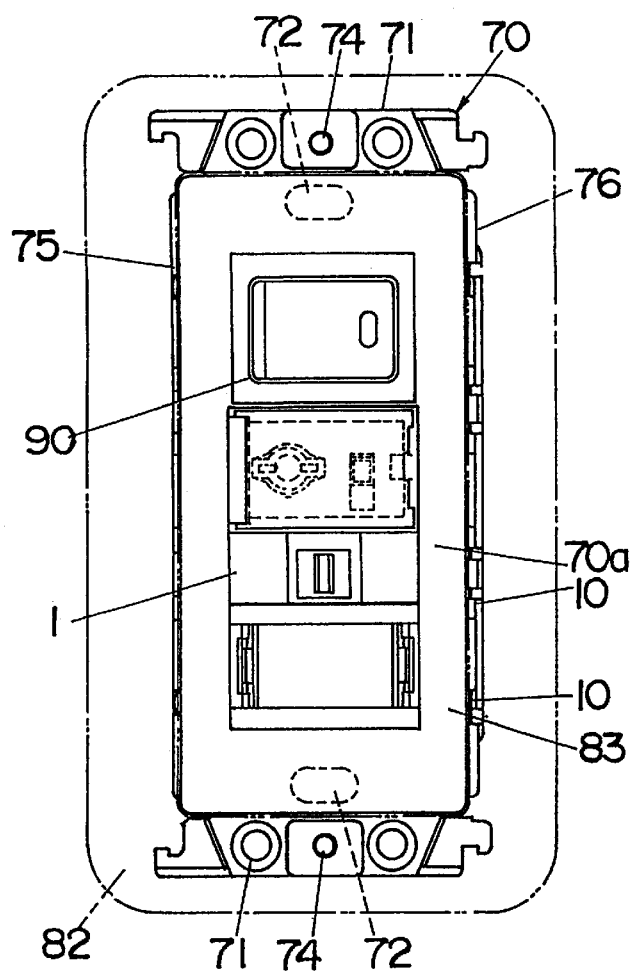
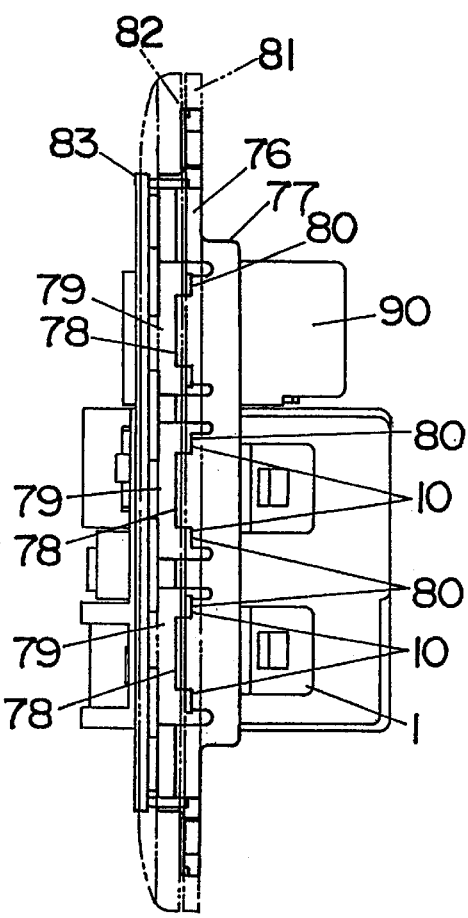

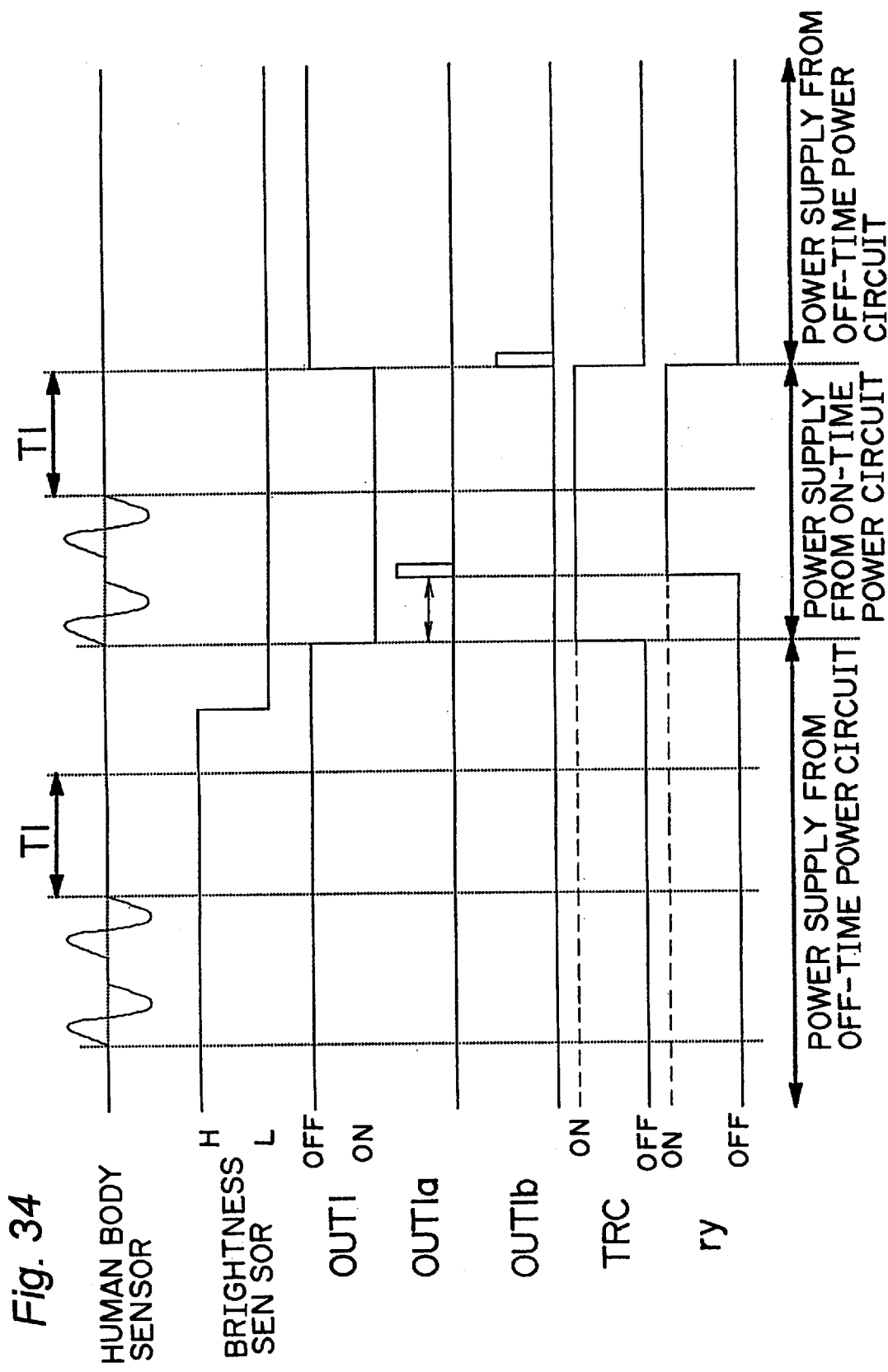

AUTOMATIC GANG SWITCH HAVING A HEAT RAY SENSOR

BACKGROUND OF THE INVENTION

1. Field of the Invention

The present invention relates to an automatic gang switch having a heat ray sensor for detecting heat rays emitted from a human body to turn a load on or off.

2. Description of the Related Art

In some of automatic gang switches having a heat ray sensor, heat rays emitted from the human body are collected on a human body detecting sensor such, for example, as a pyroelectric sensor via a lens in a predetermined detection region, and a load (for example, a light fixture) is on-off controlled based on a human body detecting signal from the human body detecting sensor. In general, such automatic gang switches are flush-mounted on a wall surface (building or working surface) of a front door, a corridor or the like, using a mounting frame fixed to the wall surface, to automatically turn on or off a lighting load by detecting a person passing through the front door, the corridor or the like.

In the automatic gang switches of the above-described construction, however, a switch for changing over the operation mode or performing various setting is accommodated within the body and, hence, cannot be operated from the front side, making it difficult to perform such setting.

SUMMARY OF THE INVENTION

The present invention has been developed to overcome the above-described disadvantages.

It is accordingly an objective of the present invention to provide an improved automatic gang switch having a heat ray sensor which is capable of easily performing a setting operation.

In accomplishing the above and other objectives, the automatic gang switch having a heat ray sensor according to the present invention is fixedly mounted on a mounting frame that has a generally rectangular opening defined therein and is secured to a substantially vertical wall. The automatic gang switch includes a housing having a body and a cover and also having a generally rectangular front portion and a mounting means for mounting the housing on the mounting frame, wherein the length of the housing is approximately two thirds of that of the generally rectangular opening of the mounting frame and the width of the housing is approximately equal to that of the generally rectangular opening of the mounting frame. The automatic gang switch also includes a human body detecting section accommodated in the housing for detecting heat rays emitted from a human body and a circuit section accommodated in the housing. The circuit section includes a control circuit for generating a control signal to turn a load on for a predetermined operation holding time when the human body detecting section generates a detection signal, a load control circuit connected to a power source and the load in series via two connecting terminals for turning on or off power supply to the load depending on the control signal, an off-time power circuit connected in parallel with the load control circuit and having an input impedance with which the load is not driven when the load control circuit is off, the off-time power circuit supplying an electric power to the control circuit when the load control circuit is off, and an on-time power circuit for supplying the electric power to the control circuit when the load control circuit is on. The automatic gang switch further includes a time setting section for setting an operation holding time and a mode setting section for changing over an operation mode of the control circuit to one of an automatic mode in which the load is automatically turned on or off depending on the detection signal from the human body detecting section, a continuous ON mode in which the load is kept on irrespective of the detection signal, and a continuous OFF mode in which the load is kept off irrespective of the detection signal. The human body detecting section, the time setting section, and the mode setting section are disposed on the front portion of the housing which is exposed from the generally rectangular opening of the mounting frame.

By the above-described construction, the automatic gang switch is fixed to a wall surface (building surface) via a ready-made mounting frame using the mounting means formed with the housing. Furthermore, because the length of the housing is approximately two thirds of that of a generally rectangular opening formed in the ready-made mounting frame and the width of the housing is approximately equal to that of the generally rectangular opening, the automatic gang switch can be juxtaposed with a flush-type wiring device of a size of single module.

It is to be noted here that some of the ready-made mounting frames for large rectangular ganged wiring devices standardized by JIS (Japanese Industrial Standard) have a generally rectangular opening that has a length approximately equal to the size of triple modules and a width approximately equal to the size of single module (the size of single module is a unit size of such large rectangular ganged wiring devices).

Also, because the human body detecting section, the time setting section, and the mode setting section are located on the front portion of the housing exposed from the opening of the mounting frame, the operation holding time or the operation mode can be set from the front face side, thus facilitating the setting operations. In addition, the electrical connection of a series circuit of the power source and the load between the two connecting terminals can reduce the number of connecting terminals, compared with the case where the connecting terminals to which the power source is connected and those to which the load is connected are separately provided. As a result, the space for accommodating the connecting terminals can be reduced, making it possible to reduce the housing.

Advantageously, the time setting section, the mode setting section, and the human body detecting section are positioned in this order from above.

The automatic gang switch further includes a lens mounted on the front portion of the housing for collecting the heat rays from a predetermined detection region on the human body detecting section, and a detection region limiting cover slidably mounted on the front portion of the housing for limiting the detection region. The detecting region limiting cover acts to block heat rays from an unnecessary region, thereby preventing malfunction of the human body detecting section. Also, because the detection region limiting cover is slidably mounted on the housing, the region to be shielded can be easily changed.

The automatic gang switch further includes first and second cover support members each having an arcuated cross-section, wherein the detection region limiting cover has an arcuated cross-section and is interposed between the first and second cover support members, and wherein the detection region limiting cover has a radius different from a radius of inner peripheral faces of the first cover support members and from a radius of outer peripheral faces of the second cover support members.

By the above-described construction, the difference in radius applies forces from the first and second cover support members to the detection region limiting cover and enlarges the contact resistance between the detection region limiting cover and the first and second cover support members. Accordingly, even if the detection region limiting cover is touched in error or vibration occurs, the detection region limiting cover does not easily move, thus preventing a change in the position thereof after adjustment. Also, because the detection region limiting cover is placed between the first and second cover support members in a bent or deformed state, a slippage during assembling or a variation in the size of component parts can be absorbed.

Preferably, the detection region limiting cover is disposed above the lens with a clearance therebetween. If the detection region limiting cover is held in close contact with the lens surface, the detection region limiting cover blocks all heat rays incident on the lens surface from a plurality of directions. However, the provision of the clearance between the detection region limiting cover and the lens makes it possible to selectively block the heat rays incident on the lens surface from the plurality of directions.

The detection area limiting cover may have projections formed therewith, while at least one of the first and second cover support members may have grooves defined therein for engagement with the projections. Such engagement generates a feeling of click and facilitates adjustment of the position.

The first cover support members may have a stopper formed therewith for maintaining at least a part of the detection region. The stopper acts to prevent the detection region limiting cover from being closed by mischief and, hence, a complete shading is avoided.

The detection region limiting cover may be made up of a plurality of plates. This construction can reduce the size of individual plates, compared with the case where the detection region limiting cover is made up of a single plate. Accordingly, the space for accommodating the detection region limiting cover can be reduced, resulting in a reduction in size of the housing.

Alternatively, the detection region limiting cover may have a flexible portion that expands or contracts according to the position of the detection region limiting cover. This construction can also reduce the space for accommodating the detection region limiting cover, resulting in a reduction in size of the housing.

Conveniently, the lens has a lens cover integrally formed therewith for covering a front face thereof. The lens cover acts to enhance the appearance of the automatic gang switch, and the one-piece construction of the lens with the lens cover can reduce the number of component parts.

Advantageously, the automatic gang switch further includes a door pivotally mounted on the front portion of the housing. The door prevents the setting of the time setting portion from being changed, for example, by mischief.

The door has opposite side walls having respective shafts formed therewith, and the housing has a bearing member for supporting the shafts. In this case, the shafts have an increasing diameter toward the side walls. The increasing diameter causes the shafts to be resistant to being broken.

Conveniently, the distance between edges of the side walls and centers of the shafts is greater than the distance between the centers of the shafts and the surface of the front portion of the housing on which the door is mounted. By so doing, when the door is opened or closed, the edges of the side walls are brought into contact with the surface of the housing. As a result, the side walls are pushed and bent outwardly, and a force for opening or closing the door acts on the side walls, thus preventing an unexpected closing of the door during setting and preventing an unexpected opening of the door from a closed state.

Again conveniently, the time setting section changes the operation holding time logarithmically depending on a change over operation thereof. By this construction, the set interval of the operation holding time is made smaller on the short time side than on the long time side. Accordingly, even if the adjustable range of the operation holding time is relatively wide, the time setting can be easily performed using only one time setting section.

It may be so designed that the operation mode of the control circuit can be set to one of the continuous ON mode and the continuous Off mode by the change over operation of the time setting section. By so doing, the time setting section can also be used as a mode setting section, resulting in a reduction in the number of component parts.

The automatic gang switch further includes a radiation plate accommodated in the housing and a circuit element thermally coupled to the radiation plate, wherein the housing has a plurality of communication holes defined therein, and the radiation plate has a plurality of through holes defined therein at portions other than those confronting the communication holes.

By the above-described construction, because the open air flows in and out of the housing through the communication holes thereof and the through holes of the radiation plate, the heat radiating effect can be enhanced. Also, because the inside of the housing is shielded by the radiation plate, the appearance of the automatic gang switch can be enhanced.

It is preferred that the load control circuit includes a triac connected between the two connecting terminals.

Alternatively, the load control circuit includes a relay having a relay contact connected between the two connecting terminals. The provision of such a relay in place of the triac can reduce heat generated by the load control circuit.

Again alternatively, the load control circuit includes a triac connected between the two connecting terminals and a relay having a relay contact connected in parallel with the triac, wherein the control circuit turns on the relay contact at a start of power supply to the load under a condition in which the triac is on.

By this construction, at the start of power supply to the load, the triac is first turned on and, hence, no rush current flows through the relay contact. Also, a relatively small relay can be used for a load having a large rush current. Further, compared with the case where only the triac is used, the current flowing through the triac is reduced, resulting in a reduction in heat generation.

BRIEF DESCRIPTION OF THE DRAWINGS

The above and other objectives and features of the present invention will become more apparent from the following description of preferred embodiments thereof with reference to the accompanying drawings, throughout which like parts are designated by like reference numerals, and wherein:

FIG. 24B is a side view of the switch assembly of FIG. 24a;

FIG. 25A is a view similar to FIG. 24A, but illustrating a modification thereof;

FIG. 25B is a side view of the switch assembly of FIG. 25A;

FIG. 34 is a chart similar to FIG. 30, but illustrating an operation of the automatic gang switch of FIG. 33.

DETAILED DESCRIPTION OF THE PREFERRED EMBODIMENTS

This application is based on application No. 11-168986 filed June 15, 1999 in Japan, the content of which is incorporated hereinto by reference.

Embodiment 1

Figure 26:
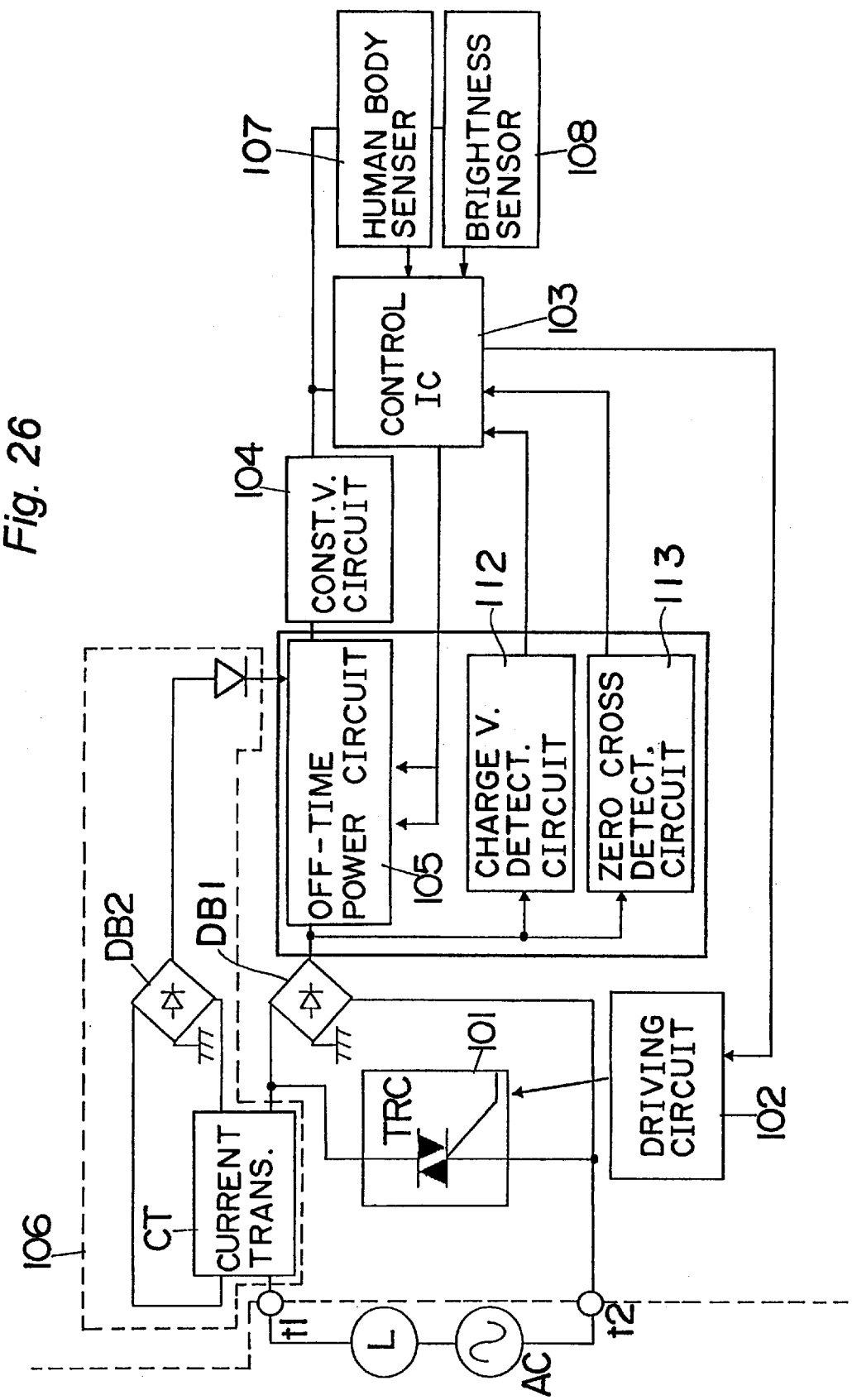
FIG. 26 is a block diagram of the automatic gang switch of FIG. 1.
Figure 27:
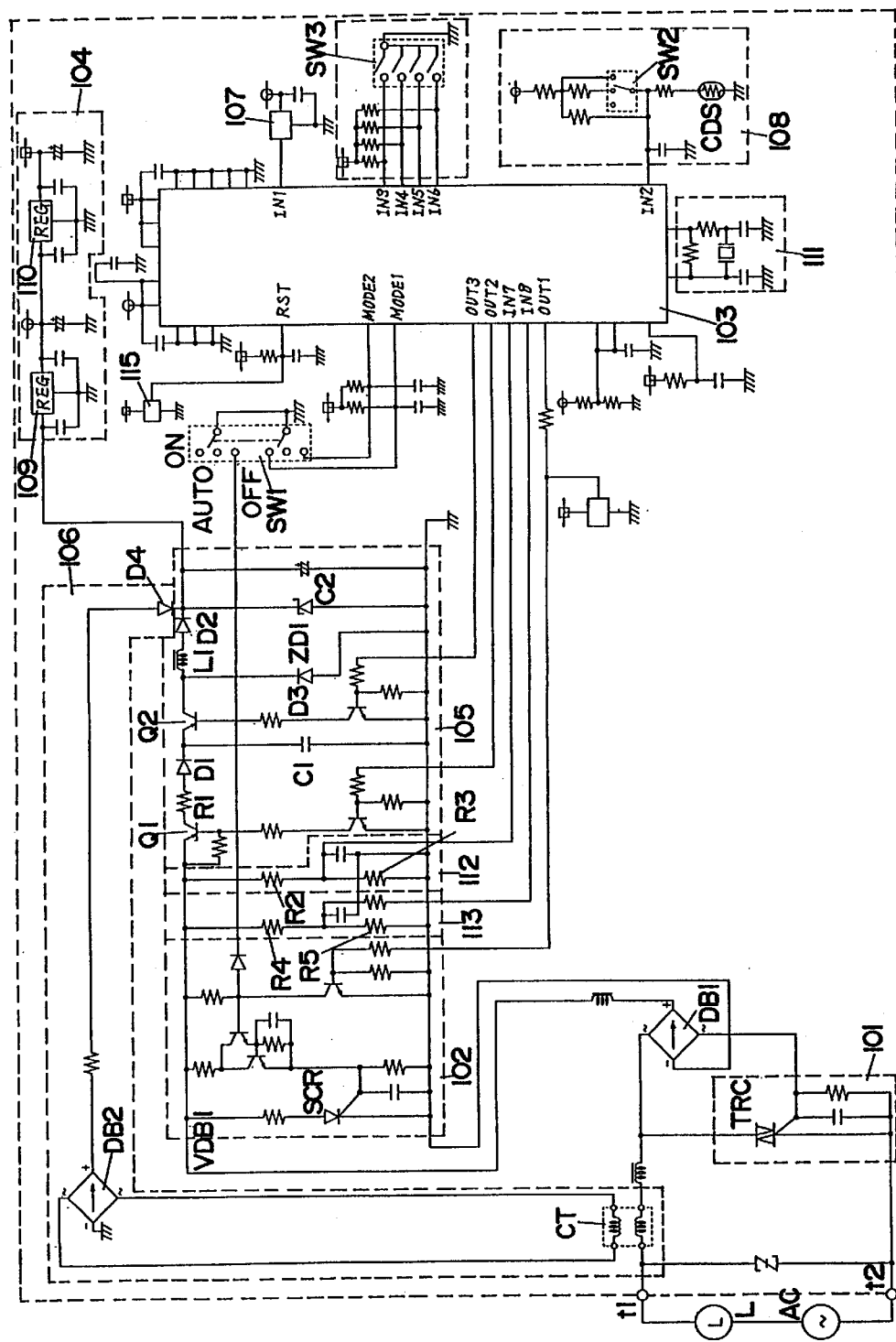
FIG. 27 is a circuit diagram of the automatic gang switch.
Figure 28:
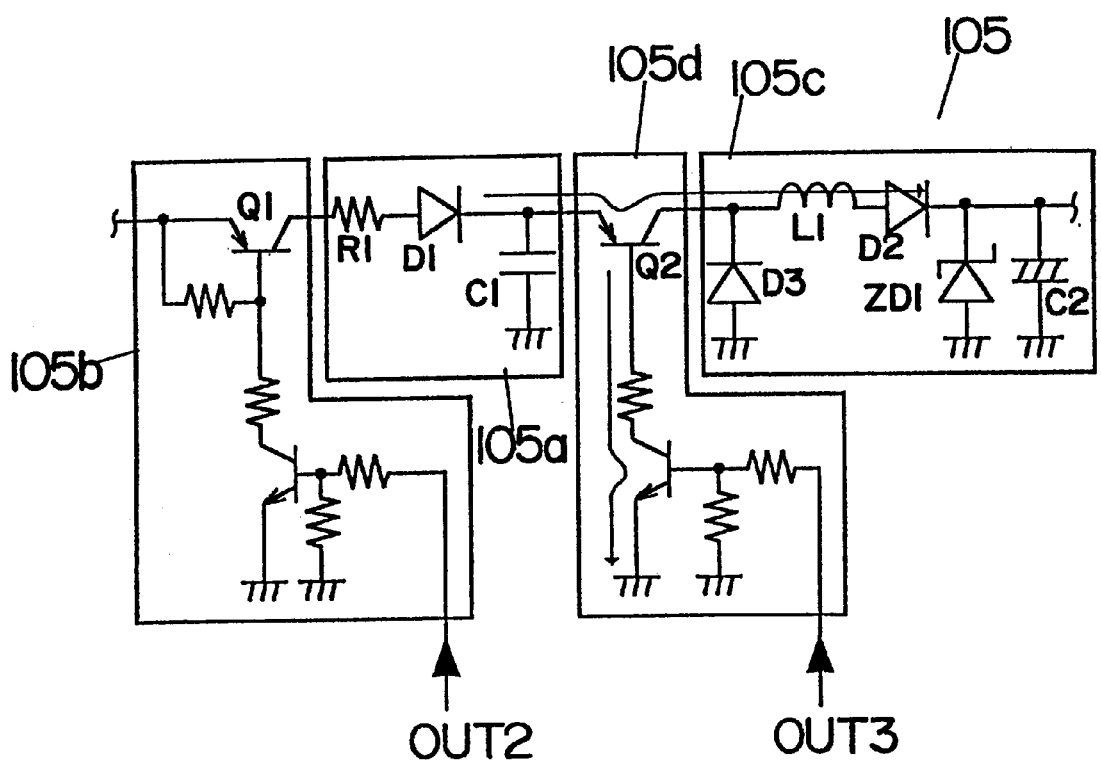
FIG. 28 is a circuit diagram of an essential portion of the automatic gang switch.

An automatic gang switch having a heat ray sensor according to a first embodiment of the present invention is described below with reference to FIGS. 1 to 30. FIG. 26 is a block diagram showing the automatic gang switch having a heat ray sensor, and FIG. 27 is a circuit diagram thereof. FIG. 28 is a circuit diagram showing an essential portion of this automatic gang switch. A load L (an illuminating load such, for example, as an incandescent lamp, a fluorescent lamp, an inverter-controlled light fixture or the like) and a commercial power source AC are connected in series between two connecting terminals t1 and t2 of the automatic gang switch having a heat ray sensor.

Moreover, a primary winding of a current transformer CT and a load control circuit 101 having a triac (triode AC switch) TRC for on-off controlling power supply to the load L are connected in series between the connecting terminals t1 and t2, and a full-wave rectifier DB1 is connected in parallel with the load control circuit 101. A driving circuit 102 having a thyristor SCR which is triggered in response to a signal input from a control IC 103 including a microcomputer and gives a control signal to a gate of the triac TRC to turn it on, and an off-time power circuit 105 for supplying power, when the load control circuit 101 is on (the load L is not driven), to a constant voltage circuit 104 for generating the operating power source of the control IC 103 are connected between the DC output terminals of the full-wave rectifier DB1. The current transformer CT, the full-wave rectifier DB2 for full-wave rectifying a current generated on a secondary winding of the current transformer CT and the like constitute an on-time power circuit 106 for supplying power to the constant voltage circuit 104 when the load control circuit 101 is off (the load L is driven). The control IC 103 and the driving circuit 102 constitute a control circuit, while a circuit section is constituted by the load control circuit 101, the control circuit, the constant voltage circuit 104, the off-time power circuit 105 and the like. Reference numeral 111 in FIG. 27 denotes a clock circuit for generating the operating clock for the control IC 103, and reference numeral 115 in FIG. 27 denotes a reset IC for resetting the control IC 103 when the power source is turned on.

A human body detecting sensor 107 includes a pyroelectric element for detecting heat rays emitted from a human body in a predetermined detection region to generate a human body detection signal. The detection signal from the human body detecting sensor 107 is input to an input terminal IN1 of the control IC 103. A brightness sensor 108 includes a photoelectric converting element such, for example, as a cadmium sulfide (CdS) cell for detecting the brightness around it. A detection signal from the brightness sensor 108 is input to an input terminal IN2 of the control IC 103. The control IC 103 generates a control signal for operating the driving circuit 102 based on the detection signal from the human body detecting sensor 107 and that from the brightness sensor 108. The brightness sensor 108 generates a detection signal of an H level if the brightness around it is greater than a predetermined threshold value, and also generates a detection signal of an L level if the brightness around it is smaller than the predetermined threshold value.

Figure 30:
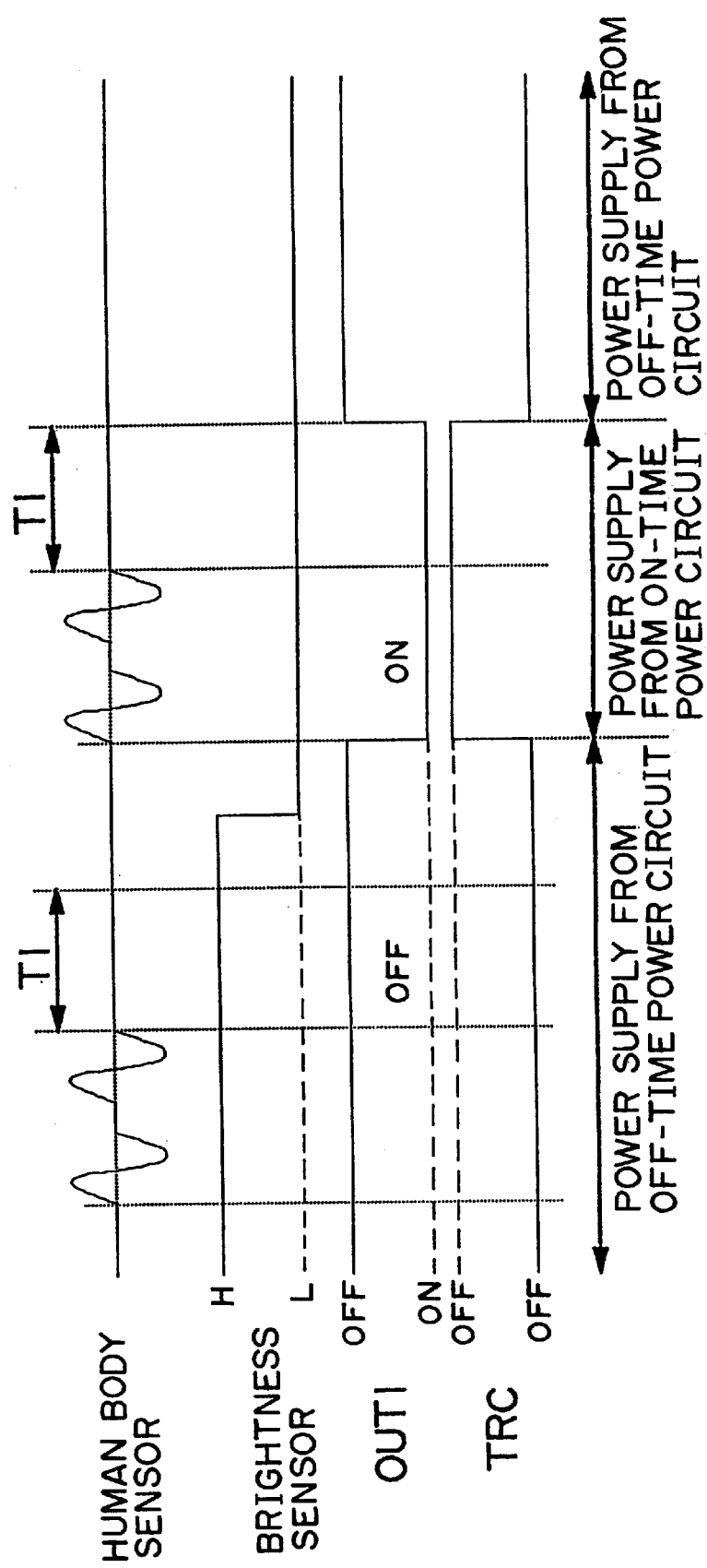
FIG. 30 is a time chart for explaining another operation of the automatic gang switch.

The operation of the automatic gang switch having a heat ray sensor is briefly described below with reference to a time chart shown in FIG. 30.

If the detection signal from the brightness sensor 108 is on the H level, that is, the brightness around it is greater than the predetermined threshold value, the control IC 103 does not output a control signal for operating the driving circuit 102 to the driving circuit 102 even if the human body detection signal is input from the human body detecting sensor 107.

On the other hand, if the detection signal from the brightness sensor 108 is on the L level, that is, the brightness around it is equal to or smaller than the predetermined threshold value, the control IC 103 outputs a control signal for operating the driving circuit 102 from an output terminal OUT1 to the driving circuit 102 when the human body detection signal is input from the human body detecting sensor 107. In the driving circuit 102, the thyristor SCR is turned on in response to the control signal input from the control IC 103, and a trigger current flows to a gate of the triac TRC so that the triac TRC is turned on. Consequently, power is supplied to the load L.

The control IC 103 outputs a control signal to the driving circuit 102 based on the human body detection signal input from the human body detecting sensor 107. At the same time, if the human body detection signal is input from the human body detecting sensor 107 within a predetermined operation holding time T1 again, the operation holding time T1 is reset. By so doing, the output time of the control signal, that is, the operation time of the load L is extended. A so-called retriggerble function is provided in this embodiment. When the time limit of the operation holding time T1 is over, the control IC 103 stops the output of the control signal and the thyristor SCR is not triggered. Consequently, the trigger current does not flow through the gate of the triac TRC, thus turning the triac TRC off and blocking the power supply to the load L.

Figure 29:
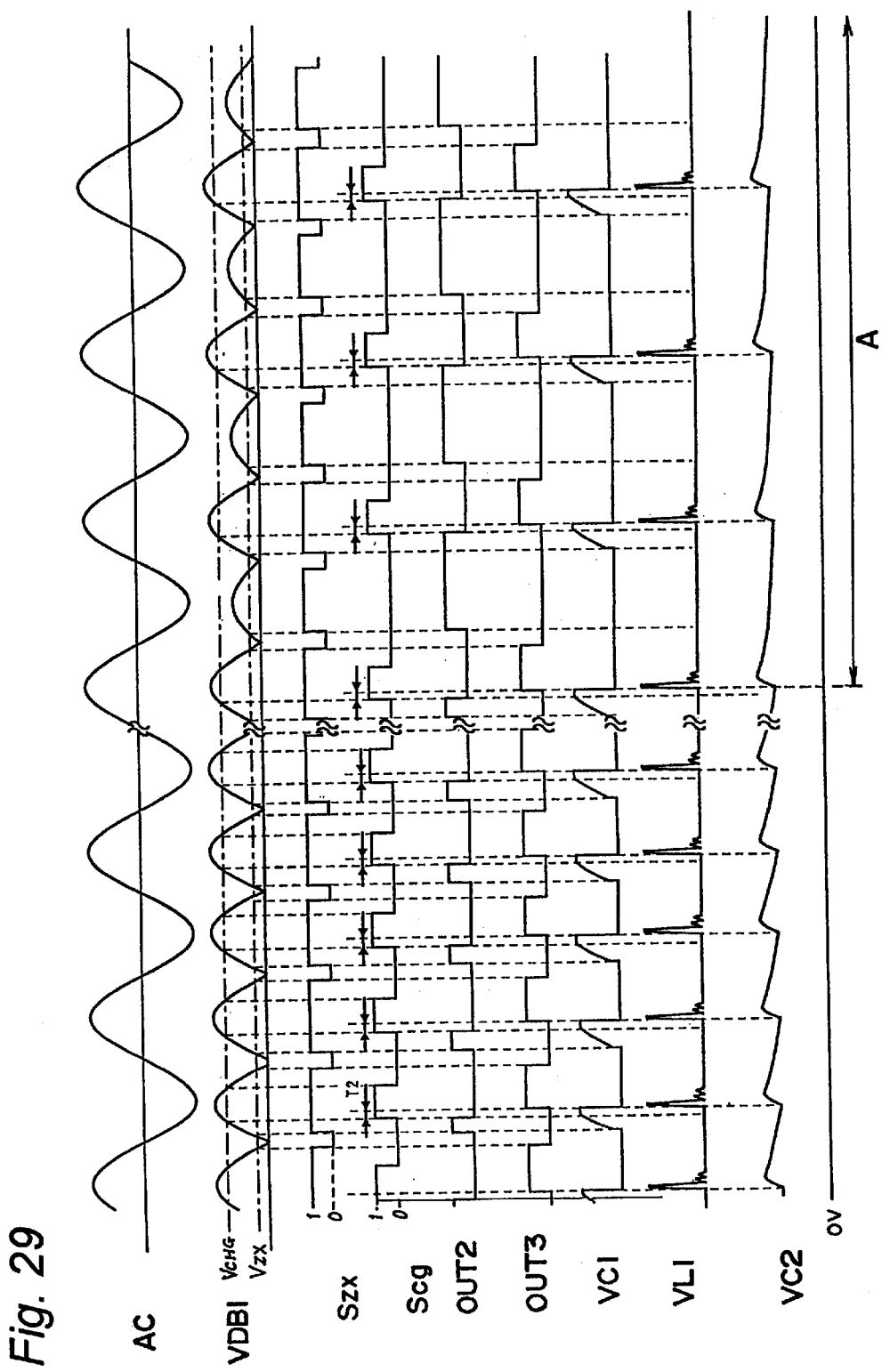
FIG. 29 is a time chart for explaining an operation of the automatic gang switch.

A zero cross detecting circuit 113 for detecting a zero cross point of the commercial power source AC is constituted by a series circuit of resistors R4 and R5 connected between the DC output terminals of the full-wave rectifier DB1 and the like. A voltage obtained by dividing the output voltage of the full-wave rectifier DB1 by the resistors R4 and R5 is input to an input terminal IN8 of the control IC 103. As shown in FIG. 29, the control IC 103 compares an output voltage VDB1 of the full-wave rectifier DB1 with a predetermined threshold voltage Vzx based on the divided voltage, thereby generating a zero cross detection signal Szx. More specifically, the control IC 103 sets the logic of the zero cross detection signal Szx to "1" when the output voltage VDB1 is higher than the threshold voltage Vzx, and to "0" when the output voltage VDB 1 is equal to or lower than the threshold voltage Vzx. The control IC 103 detects the zero cross point of the commercial power source AC from the output of the zero cross detecting circuit 113 to control a phase for triggering the thyristor SCR.

Figure 23A:
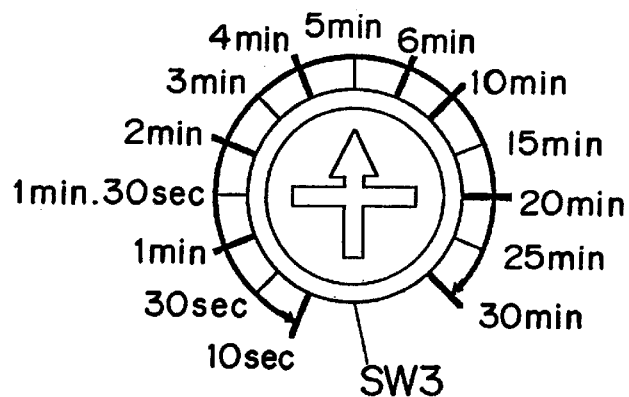
FIG. 23A is a front view of a switch for setting the operation holding time.
Figure 23B:
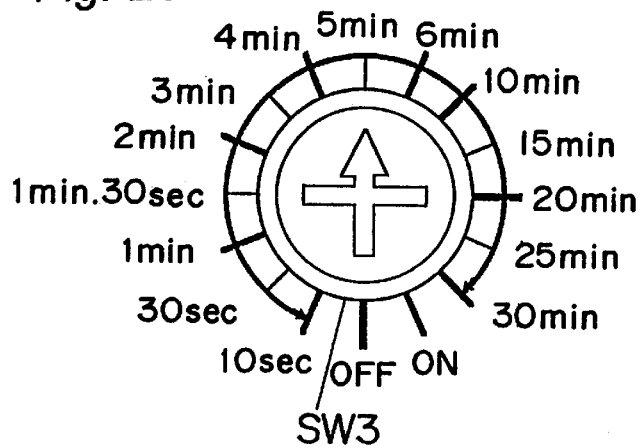
FIG. 23B is a view similar to FIG. 23A, but illustrating a modification thereof.

A switch SW3 acting as a time setting section is connected to input terminals IN3 and IN4 of the control IC 103. The voltage levels of the input terminals IN3 and IN4 varies depending on change-over operations of the switch SW3, and the operation holding time T1 is switched to any one of a plurality of lengths (for example, 10 seconds to 30 minutes). In the case where a volume that changes the operation holding time T1 in proportion to the amount of operation is used, there is a problem in that if the set range of the operation holding time T1 is relatively wide, for example, in the range of 10 seconds to 30 minutes, a difficulty is encountered in adjusting the short time side (for example, one minute). In the present embodiment, a rotary-type dip switch is used for the switch SW3. As shown in FIG. 23A, the operation holding time T1 is logarithmically changed depending on the change over operation of the switch SW3 or the position of the switch SW3. More specifically, the set interval of the operation holding time T1 is made small on the short time side and is made great on the long time side, making it possible to easily perform the time setting from the short time side to the long time side by the use of only one switch SW3. As shown in FIG. 23B, it is also possible to set continuous OFF (in which the load L is forcibly kept off) or continuous ON (in which the load L is forcibly kept on by the change-over operation of the switch SW3. Furthermore, it is not necessary to separately provide a switch for changing over the operation mode of the control circuit into a continuous OFF mode (in which the load control circuit 101 is forcibly kept off irrespective of the detection signals of the human body detecting sensor 107 and the brightness sensor 108) or a continuous ON mode (in which the load control circuit 101 is forcibly kept on irrespective of the detection signals of the human body detecting sensor 107 and the brightness sensor 108), resulting in a reduction in the number of switches and also in cost.

Moreover, the threshold value of the brightness can be switched to two levels of "bright" (for example, 14 to 80 luxes) and "dark" (for example, 5 to 20 luxes) by the change-over operation of the switch SW2, or the state (OFF state) in which the control IC 103 is operated based on only the detection signal of the human body detecting sensor 107 irrespective of the output of the brightness sensor 108 can be set. Furthermore, a mode change-over switch SW1 is connected as a mode setting section to mode setting terminals MODE1 and MODE2 of the control IC 103. When the signal level of the mode setting terminal MODE1 is set to have the "L" level according to the operation of the mode changeover switch SW1, the operation mode of the circuit is changed over to the continuous ON mode. When the signal level of the mode setting terminal MODE2 is set to have the "L" level, the operation mode of the circuit is changed over to the continuous OFF mode. When the signal levels of the mode setting terminals MODE1 and MODE2 are set to have the "H" level, the operation mode of the circuit is changed over to an automatic mode (in which the control IC 103 outputs a control signal to the driving circuit 2 based on the detection signals of the human body detecting sensor 107 and the brightness sensor 108, and the load control circuit 101 is automatically turned on or off).

As shown in FIG. 28, the off-time power circuit 105 includes a charging circuit 105a having a capacitor C1 that is charged by the output of the full-wave rectifier DB1, a charging control circuit 105b for turning on or off a charging current flowing from the full-wave rectifier DB1 to the capacitor C1, a voltage converting circuit 105c for receiving a discharging current from the capacitor C1 and for generating an almost constant voltage obtained by dropping a voltage applied to both ends of the capacitor C1, and a discharging control circuit 105d for turning on or off the discharging current flowing from the capacitor C1 to the voltage converting circuit 105c.

The charging control circuit 105b includes a switching element Q1 that is comprised of a transistor having an emitter and a collector connected between a DC output terminal on the high potential side of the full-wave rectilinear DB1 and the charging circuit 105a. The switching element Q1 is turned on or off in response to a signal input from an output terminal OUT2 of the control IC 103. The charging circuit 105a includes a series circuit of the resistor R1, the diode D1 and the capacitor C1 which are connected through the switching element Q1 between the DC output terminals of the full-wave rectifier DB1. The discharging control circuit 105d includes a switching element Q2 that is comprised of a transistor having an emitter and a collector connected between a connection point of the diode D1 and the capacitor C1 and the voltage converting circuit 105c, and the switching element Q2 is turned on or off in response to a signal input from the output terminal OUT3 of the control IC 103. The voltage converting circuit 105c includes a series circuit of an inductor L1, a diode D2 and a capacitor C2 which are connected through the switching element Q2 between both ends of the capacitor C1, a diode D3 having a cathode connected to a connection point of the switching element Q2 and the inductor L1 and an anode connected to a connection point of the capacitors C1 and C2, and a Zener diode ZD1 connected in anti-parallel with the capacitor C2, thereby forming a so-called step-down chopper.

A charge voltage detecting circuit 112 for detecting the charging voltage of the capacitor C1 includes a series circuit of the resistors R2 and R3 connected between the DC output terminals of the full-wave rectifier DB1 and the like. The electric potential of the connection point of the resistors R2 and R3 is input to the input terminal IN7 of the control IC 103. The control IC 103 compares the output voltage VDB1 of the full-wave rectifier DB1 with a predetermined charge voltage Vcg (that is, the charging voltage VC1 of the capacitor C1 with a preset threshold voltage) based on the electric potential on the connection point of the resistors R2 and R3, thereby generating a charge voltage detection signal Scg. More specifically, the control IC 103 sets the logic of the charge voltage detection signal Scg to "1" when the output voltage VDB1 is higher than the charge voltage Vcg, and also sets the logic of the charge voltage detection signal Scg to "0" when the output voltage VDB1 is equal to or lower than the threshold voltage Vcg.

The operation of the power circuit 105 at the time of the off-state of the load control section 101 is briefly described below with reference to FIG. 29. When the supply voltage of the commercial power source AC exceeds the zero cross point and the logic of the zero cross detection signal Szx is changed from "0" to "1" under the condition in which the switching elements Q1 and Q2 are both off, the control IC 103 turns the switching element Q1 on. At this time, a current flows through the full-wave rectifier DB1, the switching element Q1, the resistor R1, the diode D1, the capacitor C1 and the full-wave rectifier DB1 in this order, thereby charging the capacitor C1.

Upon increase of the voltage VC1 at both ends of the capacitor FC1, when it is charged to a preset threshold voltage and the logic of the charge voltage detection signal Scg is changed from "0" to "1", the control IC 103 turns the switching element Q1 off to stop the charging operation of the capacitor C1. When the switching element Q1 is turned off and a predetermined time T2 passes, the control IC 103 turns the switching element Q2 on, and the discharging current of the capacitor C1 flows through the capacitor C1, the switching element Q2, the inductor L1, the diode D2, the capacitor C2 and the capacitor C1 in this order, thereby supplying the inductor L1 and the capacitor C2 with energy. When a constant voltage is generated between both ends of the constant voltage circuit including the capacitor C2 and the Zener diode ZD1, and is then stabilized by regulators ICs 109 and 110 of the constant voltage circuit 104 before it is supplied to the control IC 103.

Thereafter, when the supply voltage of the commercial power source AC is dropped to a point close to the zero cross point and the logic of the zero cross detection signal Szx is changed from "1" to "0", the control IC 103 turns the switching element Q2 off and stops the discharge from the capacitor C1 to the voltage converting circuit 105c. Furthermore, when the supply voltage of the commercial power source AC exceeds the zero cross point and the logic of the zero cross detection signal Szx is changed from "0" to "1" again, the control IC 103 turns the switching element Q1 on to cause a charging current to flow from the full-wave rectifier DB1 to the capacitor C1, thus repeating the above-mentioned processes. A region A shown in FIG. 29 indicates the case where the load L has a rectifying function. Also in the case where only a half wave is input from the full-wave rectifier DB1 to the off-time power circuit 105, the off-time power circuit 105 is operable.

At the on-time of the load control circuit 101 a current corresponding to a load current is generated on the secondary side of the current transformer CT of the on-time power circuit 106. The same current is rectified by the rectifier DB2 and charges the capacitor C2 through the resistor R6 and the diode D4. Consequently, a constant voltage is generated on the constant voltage circuit including the capacitor C2 and the Zener diode ZD1, and power is supplied to the constant voltage circuit 104.

Although the off-time power circuit 105 is connected in parallel with the load control circuit 101, the input impedance of the off-time power circuit 105 is set to a high value so that the load L cannot be driven when the load control circuit 101 is off. Accordingly, only a slight input current flows through the off-time power circuit 105, and the load L cannot be driven even if the load L is a glow discharge lamp.

Because a two-wire circuit is employed wherein a series circuit of the load L and the commercial power source AC is connected between the two connecting terminals t1 and t2, the number of the connecting terminals can be reduced compared with a four-wire circuit including two power connecting terminals to which the commercial power source AC is connected and two load connecting terminals to which the load L is connected. Accordingly, the space for accommodating the connecting terminals can be reduced, resulting in a reduction in size of the automatic gang switch having a heat ray sensor.

Next, the structure of an housing 1 for accommodating the human body detecting sensor 107, the brightness sensor 108 and the circuit section is discussed.

The housing 1 includes a generally box-shaped body 2 formed of a synthetic resin such as a melamine phenol resin and having an openable front face, and a cover 3 formed of a synthetic resin such as an ABS resin for covering the front face of the body 2.

The body 2 has two protrusions 4 integrally formed therewith on each of two opposite side faces thereof so as to protrude laterally outwardly therefrom. The inside of the body 2 is divided by a partition wall into a printed board storage compartment 5a for accommodating two printed boards 27 and 28 having the circuit section mounted thereon and a terminal storage compartment 5b for accommodating terminals of a well-known quick-coupling structure that includes locking springs 41 and a release button 42. The terminal storage compartment 5b is provided at its bottom wall with electric wire insertion holes 6 for inserting electric wires from the bottom of the body 2 and with an operation hole 7 for inserting a tool such as a screwdriver from the bottom of the body 2 to operate the release button 42 so that the electric wires may be disconnected from the locking springs 41, respectively.

Because the connecting terminals t1 and t2 are of the quick-coupling structure, a mere insertion of the cores of the electric wires into the electric wire insertion holes 6 results in an electrical connection of the electric wires with the locking springs 41. In addition, when the electric wires are to be removed, the locking springs 41 are disconnected therefrom merely by inserting a tool into the operation hole 7 to operate the release button 42. Thus, the work for connecting or disconnecting the electric wires can easily be carried out. In place of the terminals of the quick-coupling structure, screw terminals may also be used. In this case, the size of the space for accommodating the terminals can be reduced as compared with the terminals of the quick-coupling structure. Therefore, the size of the housing 1 can further be reduced.

The printed board 28 on which power circuits such as the off-time power circuit 105, the on-time power circuit 106 and the like are mounted is accommodated in the body 2 on the bottom side thereof, while the printed board 27 on which weak electric circuits such as the control IC 103 and the like are mounted is accommodated in the body 2 on the front side thereof. The two printed boards 27 and 28 are electrically connected to each other via electric wires (not shown). Moreover, a terminal plate of the quick-coupling structure is soldered to the printed board 28. The printed board 27 having the weak electric circuits is generally rectangular, and has the human body detecting sensor 107 and the brightness sensor 108 mounted on one side in the longitudinal direction thereof, the mode change-over switch SW1 mounted on a generally central portion thereof, and the switches SW2 and SW3 mounted on the other side thereof.

As shown in FIGS. 3 to 6, a generally U-shaped radiation plate 38 formed of a material having a high thermal conductivity such as aluminum is accommodated in the printed board storage compartment 5a. The radiation plate 38 has a central piece 38a and side pieces 38b and 38c extending from both side edges of the central piece 38a in the same direction. A heating element 116 mounted on a substrate is thermally coupled to the central piece 38a with a screw 39. The radiation plate 38 is accommodated in the body 2 with the side pieces 38b and 38c opposed to the upper and lower faces of the body 2 (the upper and lower faces of the body 2 when the body 2 is fixed to a working face (substantially vertical wall)). Upper and lower walls of the body 2 have a plurality of elongated openings (communication holes) 40 defined therein that extend from the back face side of the body 2 toward the front face side thereof to cause the inside and outside of the body 2 to communicate with each other. Similarly, the radiation plate 38 has a plurality of elongated openings (through holes) 38d defined in the side pieces 38b and 38c at portions other than the portions confronting the elongated openings 40 and extending substantially parallel therewith. When the radiation plate 38 is accommodated in the body 2, the elongated openings 40 provided in the body 2 and the elongated openings 38d provided in the radiation plate 38 are positioned alternately.

In conventional automatic gang switches having a heat ray sensor, openings for radiation are provided in only the body 2, and no openings are provided in the radiation plate 38 to be accommodated in the body 2. Therefore, air enters the housing 1 with difficulty and heat exchange is carried out between the radiation plate 38 and outside air to discharge heat from the housing 1, resulting in insufficient radiation. On the other hand, in the present embodiment, the elongated openings 40 for radiation are provided in the upper and lower faces of the body 2, while the elongated openings 38d for radiation are similarly provided in the side pieces 38b and 38c of the radiation plate 38 confronting the upper and lower faces of the body 2, with the elongated openings 38d and 40 positioned alternately. Therefore, air enters or gets outs of the housing 1 through the elongated openings 38d and 40, resulting in enhanced radiation. In order to facilitate the air flow, a clearance is provided between the internal wall of the body 2 and the radiation plate 38.

Moreover, the elongated openings 38d and 40 are formed in the vertical direction of the housing 1. Because warm air goes up, the outside air flows through the elongated openings 40 in the lower wall of the body 2 into the housing 1 and through the elongated openings 38d in the side piece 38c, and then flows through the elongated openings 38d in the side piece 38b and through the elongated openings 40 in the upper wall of the body 2. In short, air can easily enter or get out of the housing 1 by convection. Furthermore, the elongated openings 38d and 40 are provided alternately, and the radiation plate 38 faces the elongated openings 40 of the body 2. Therefore, the inside of the housing 1 cannot be seen from the outside and the appearance can be improved. In addition, the radiation plate 38 is accommodated in the body 2, and intervals between the elongated openings 40 are sufficiently small. Therefore, the radiation plate 38 cannot be directly touched from the outside, enhancing safety.

On the other hand, the front face of the cover 3 has a generally rectangular shape, and a generally parallelepiped stand 8 is formed on the front face of the cover 3. The stand 8 has stepped or shoulder portions 9 formed on respective sides thereof, which are lower by one step than the stand 8. Each shoulder portion 9 has two sets of two-claw pieces 10 extending laterally outwardly therefrom, and also has two coupling recesses 11 formed therewith so as to open laterally outwardly. By utilizing either the claw pieces 10 or the coupling recesses 11, the housing 1 can be attached to a mounting frame made of a metal or a synthetic resin. That is, the claw pieces 10 and the coupling recesses 11 constitute a mounting means that is used to fix the housing 1 to the mounting frame.

The stand 8 also has a generally rectangular depression 12 formed on one side in the longitudinal direction thereof, and the depression 12 has two openings 13 and 14 defined therein, through which operation knobs of the switches SW2 and SW3 extend, respectively. A bearing member 16 for supporting shafts 15a of a door 15 pivotally mounted on the cover 3 is provided on one side of the depression 12, and an opening 17 is formed in the depression 12 on the other side thereof. The stand 8 further has an opening 18 defined therein at a center thereof, through which an operation knob of the mode change-over switch SW1 extends. The stand 8 also has a sensor window 19 formed on the other side in the longitudinal direction thereof, which faces the light receiving faces of the human body detecting sensor 107 and the brightness sensor 108. The cover 3 has a pair of tabs 20 formed therewith on each side thereof so as to extend rearwardly from the rear edge thereof. Each tab 20 has an engagement hole 20a defined therein for detachably receiving associated one of the protrusions 4 of the body 2.

By the engagement of the protrusions 4 of the body 2 and the engagement holes 20a of the tabs 20 of the cover 3, the body 2 and the cover 3 can be easily coupled to each other. Each protrusion 4 has an inclined surface 4a, which acts to guide a distal or free end of the tab 20 when the cover 3 is attached to the body 2, thus facilitating the attachment work.

Figure 1:
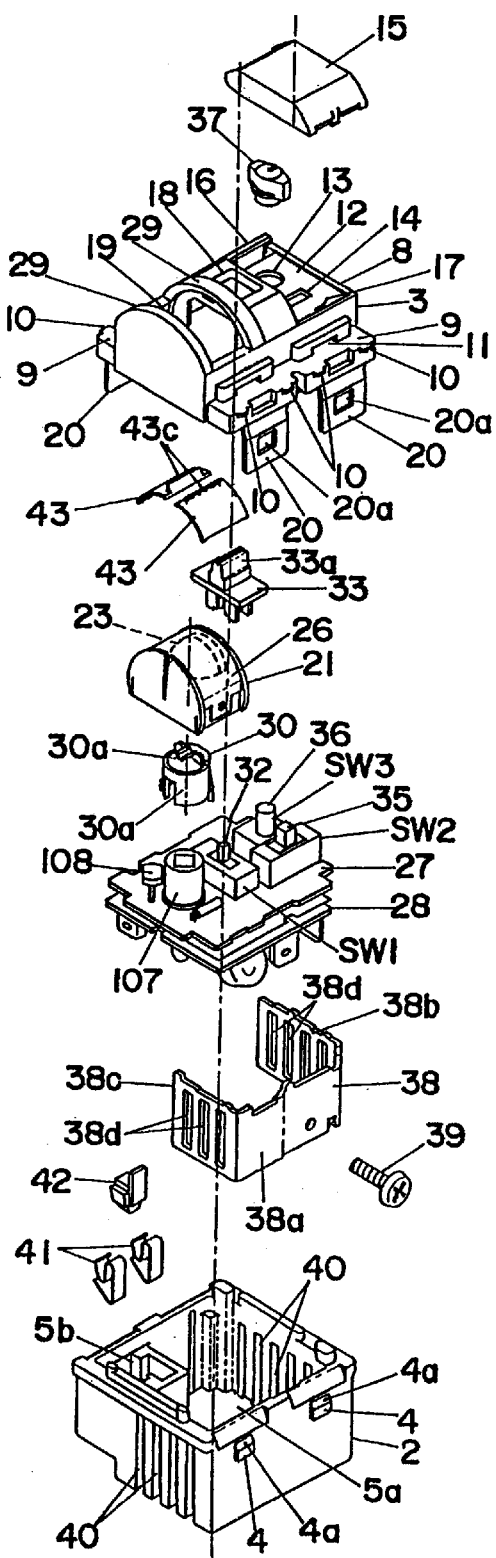
FIG. 1 is an exploded perspective view of an automatic gang switch having a heat ray sensor according to a first embodiment of the present invention.
Figure 2A:
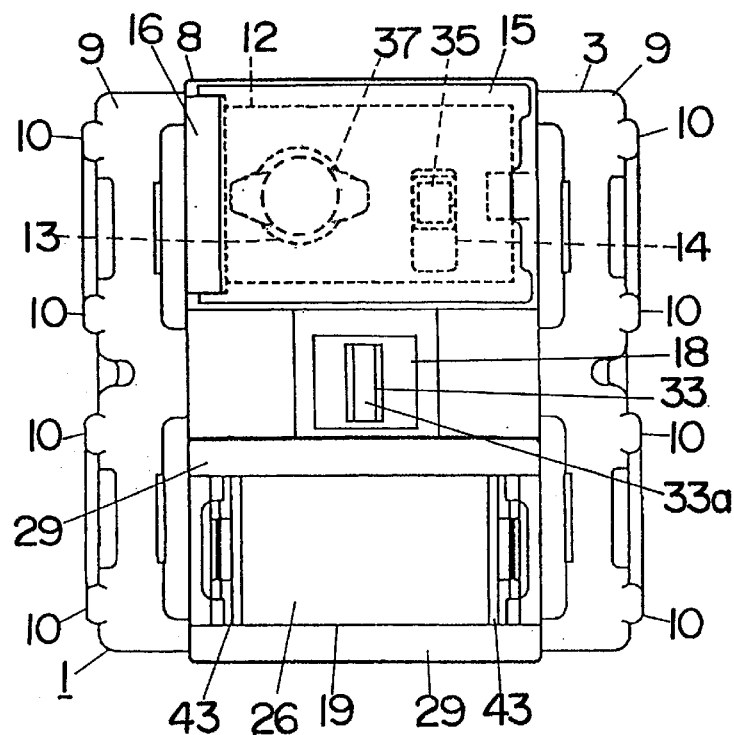
FIG. 2A is a front view of the automatic gang switch of FIG. 1.
Figure 2B:
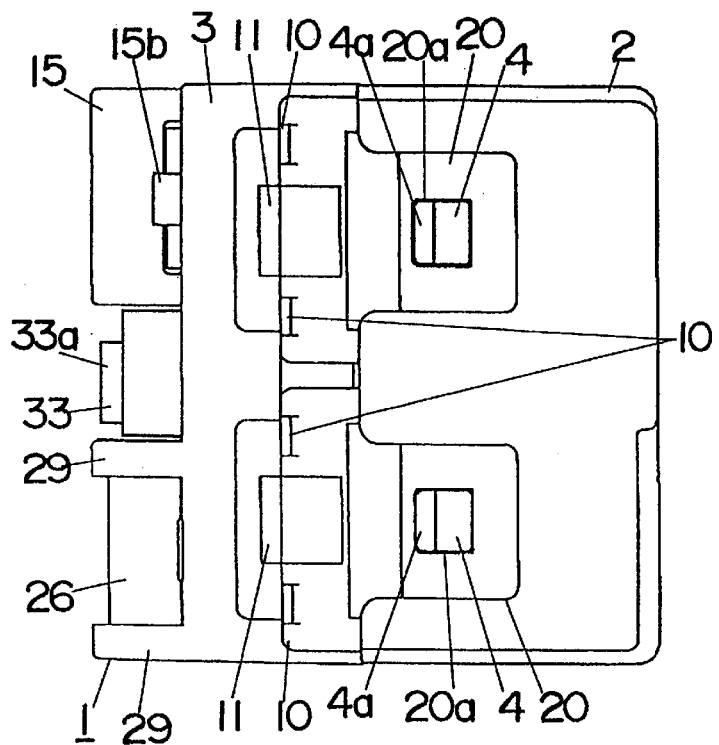
FIG. 2B is a side view of the automatic gang switch of FIG. 1.
Figure 3:
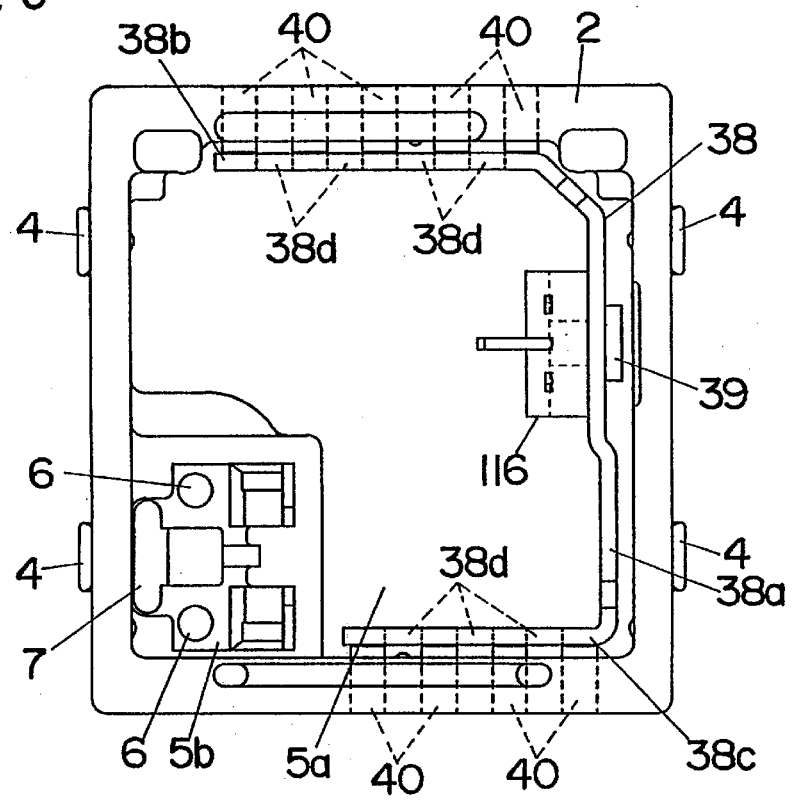
FIG. 3 is a front view of a body of the automatic gang switch of FIG. 1 in which a radiation plate has been incorporated.
Figure 4:
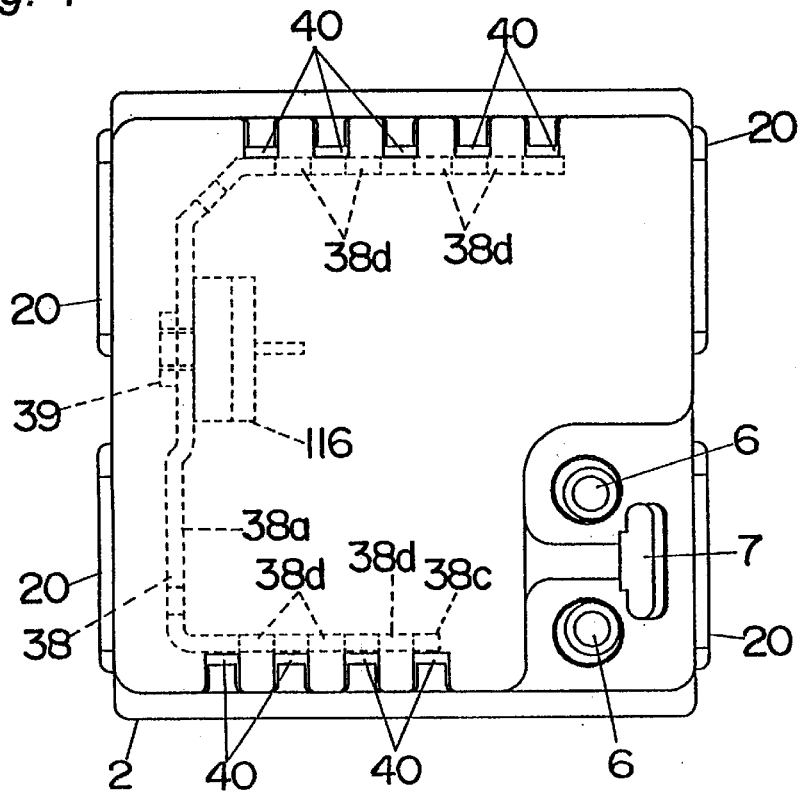
FIG. 4 is a rear view of the body of FIG. 3.
Figure 5A:
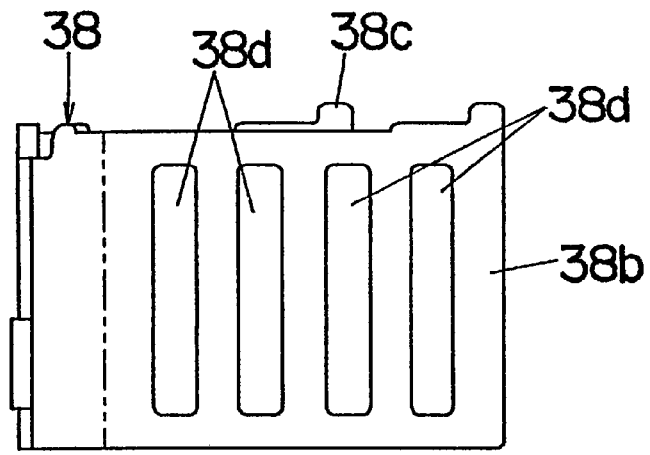
FIG. 5A is a top plan view of the radiation plate.
Figure 5B:
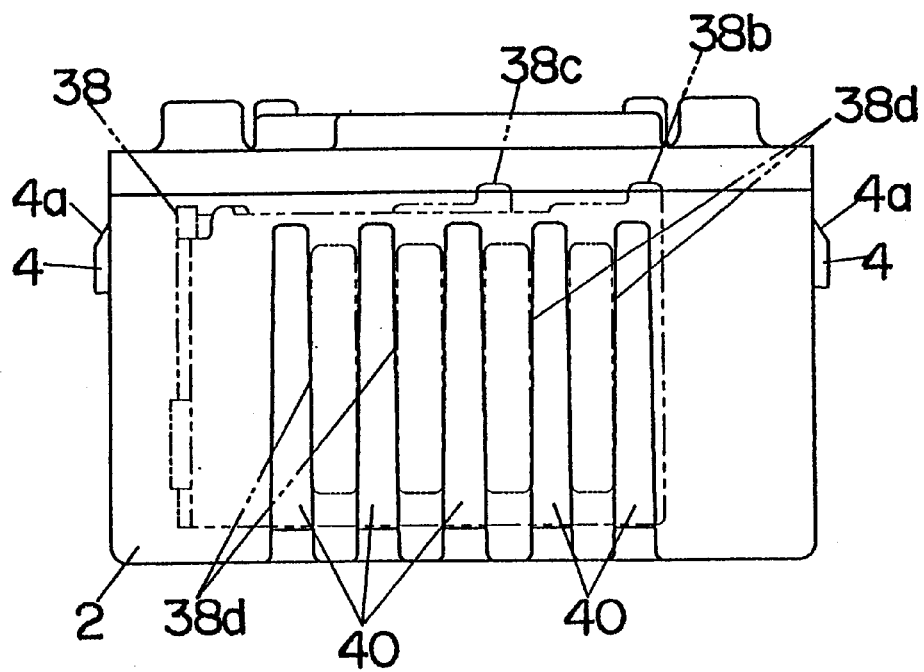
FIG. 5B is a top plan view of the body in which the radiation plate has been incorporated.
Figure 6A:
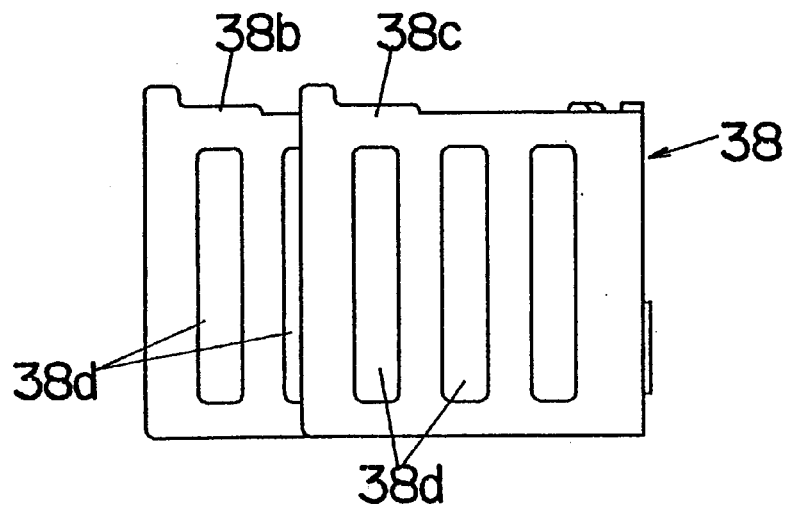
FIG. 6A is a bottom plan view of the radiation plate.
Figure 6B:
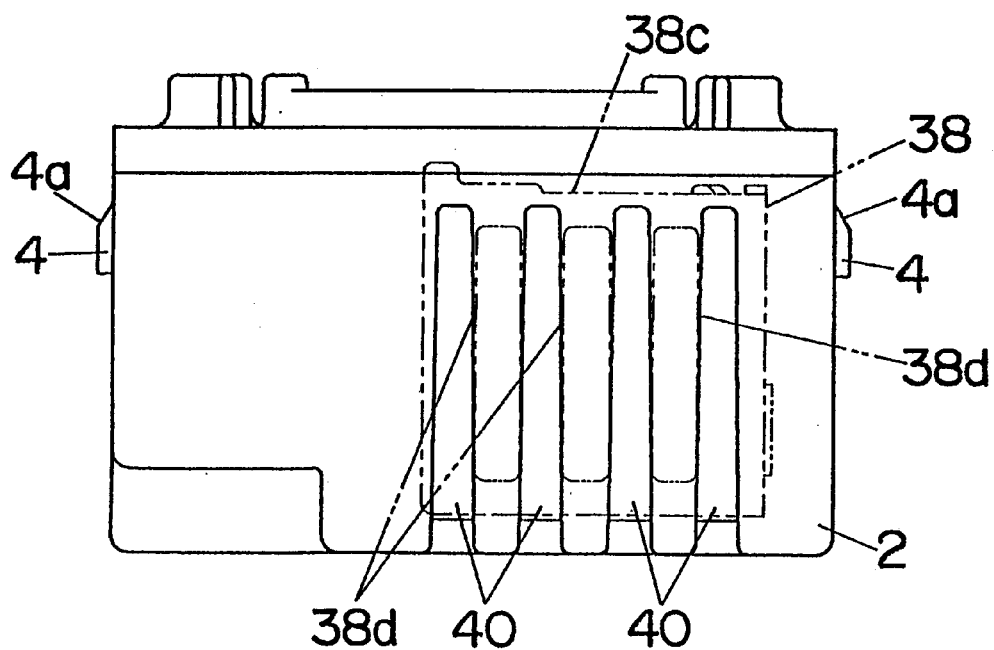
FIG. 6B is a bottom plan view of the body in which the radiation plate has been incorporated.
Figure 7A:
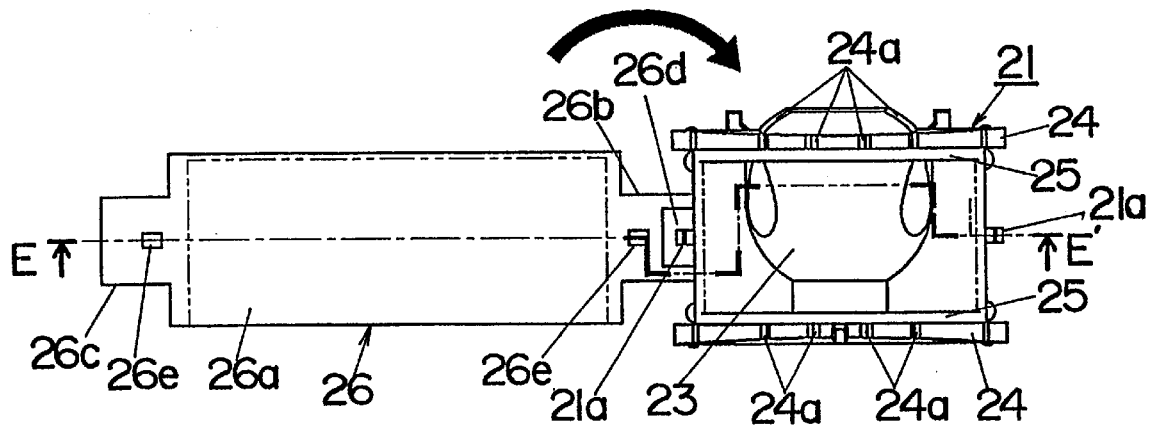
FIG. 7A is a front view of a lens body before a lens cover is fixed.

The sensor window 19 of the cover 3 is covered with a lens body 21 having a lens for collecting outside light (including heat rays) on the light receiving faces of the human body detecting sensor 107 and the brightness sensor 108. The human body detecting sensor 107, the lens body 21 and the like constitute a human body detecting section. The lens body 21 is formed of a translucent material such as high-density polyethylene (HDPE), for example. As shown in FIGS. 7 and 8, a generally hemispherical lens 28 formed of a Fresnel lens is provided integrally with the front face of the lens body 21. Moreover, a lens cover 26 for protecting the lens 23 is provided to cover the front face of the lens 23. The lens cover 26 includes a central piece 26a exposed forward from the sensor window 19, and fixing pieces 26b and 26c integrally formed with the central piece 26a on respective sides thereof and having a smaller width than the width of the central piece 26a. The lens cover 26 is coupled to the lens body 21 via the fixing piece 26b, and the lens cover 26 is formed integrally with the lens body 21.

The lens body 21 is provided with two (upper and lower) generally semicircular lens cover support frames 25 and 25 that act to support the lens cover 26, and with two protrusions 21a and 21a formed at opposite end faces of the lens body 21. Two cover support frames 24 and 24 having a greater diameter than the diameter of the lens cover support frames 25 and 25 are formed on upper and lower sides of the lens cover support frames 25 and 25, respectively. Furthermore, the lens body 21 is also provided with generally semicircular covering members 29 and 29 protruding from the upper and lower edges of the sensor window 19, and the lens cover support frames 25 and 25 are covered with the covering members 29 and 29, respectively. Each fixing piece 26b has an engagement hole 26e defined therein for engagement with associated one of the protrusions 21a. The covering members 29 and the cover support frames 24 constitute first and second cover support members, respectively, for sandwiching area limiting covers 43 (described later) therebetween.

Figure 7B:
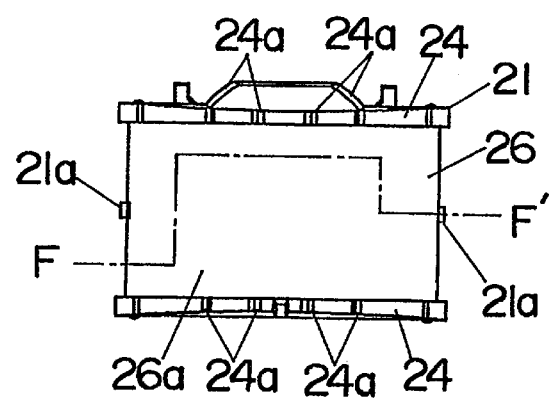
FIG. 7B is a front view of the lens body after the lens cover has been fixed.
Figure 8A:
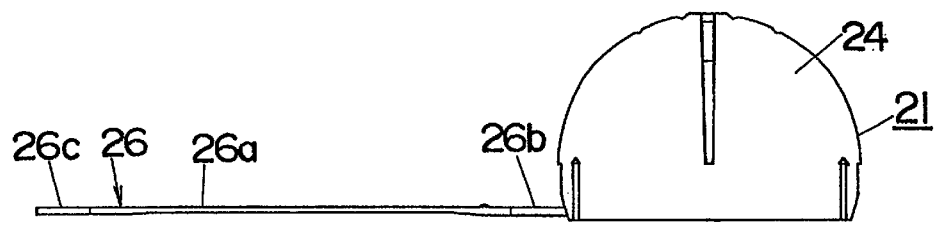
FIG. 8A is a bottom plan view of the lens body before the lens cover is fixed.
Figure 8B:
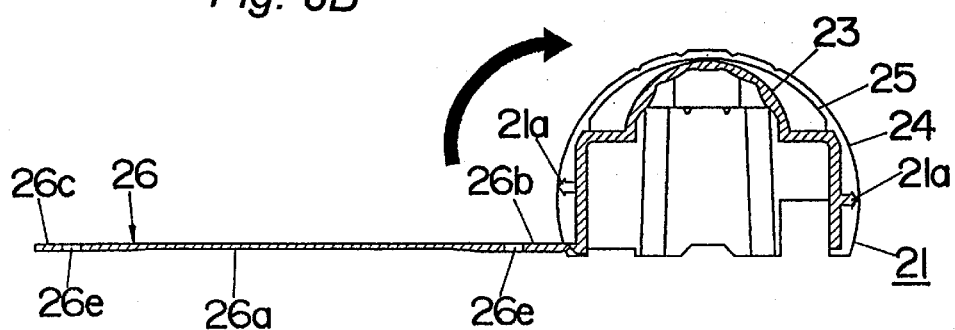
FIG. 8B is a cross-sectional view taken along line E–E' in FIG. 7A.
Figure 8C:
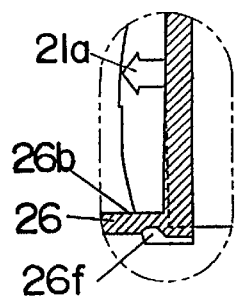
FIG. 8C is an enlarged cross-sectional view of an essential portion of the lens body.
Figure 8D:
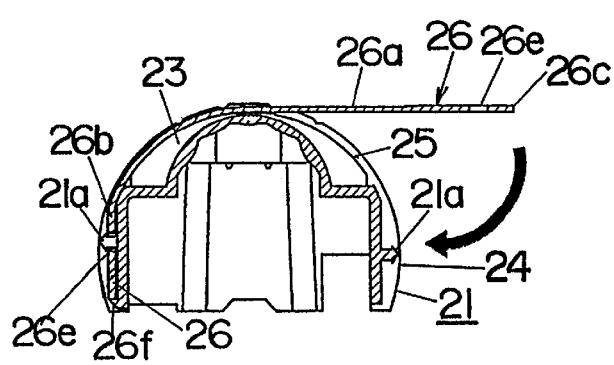
FIG. 8D is a view similar to FIG. 8B, but particularly illustrating a state in which the lens cover is being fixed.
Figure 9A:
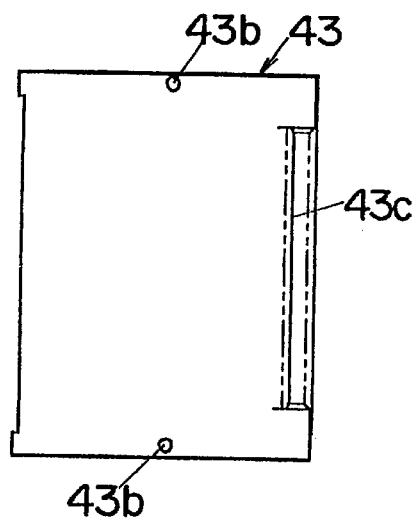
FIG. 9A is a front view of an area limiting cover mounted on the lens body of FIG. 7A.
Figure 9B:
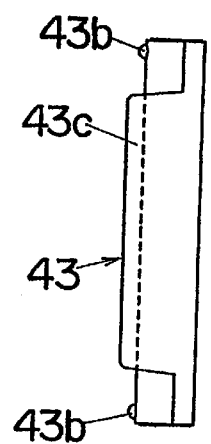
FIG. 9B is a side view of the area limiting cover.
Figure 9C:
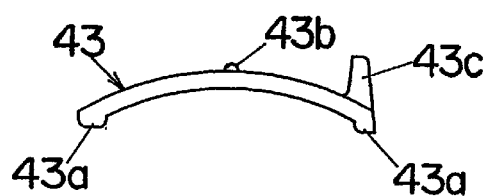
FIG. 9C is a bottom plan view of the area limiting cover.
Figure 9D:
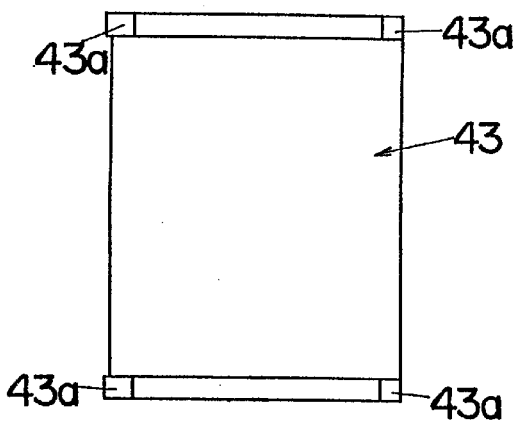
FIG. 9D is a rear view of the area limiting cover.

As shown in FIG. 8C, a thin hinge member 26f is formed in the vicinity of a coupling portion of the fixing piece 26b to the lens body 21, and the lens cover 26 is bent at the hinge member 26f. The fixing piece 26b has a hole 26d defined therein at a center of the coupling portion of the fixing piece 26b to the lens body 21 and, hence, the lens cover 26 can be bent easily. As shown in FIGS. 7B and 8D, the lens cover 26 is bent at the hinge member 26f and is wound upon the lens body 21 along the surfaces of the lens cover support frames 25 and 25, thereby engaging the protrusions 21a protruding from opposite end faces of the lens body 21 with the engagement holes 26e of the lens cover 26. Thus, the lens cover 26 is fixed to the lens body 21. In the case where the automatic gang switch having a heat ray sensor is attached to the face of a wall, the beauty is spoilt if the lens 23 is exposed and, hence, the lens cover 26 is required. If the lens cover 26 is provided separately from the lens body 21, the number of parts is increased. In the present embodiment, the lens cover 26 bent at the hinge member 26f is formed integrally with the lens body 21, and the lens cover 26 is attached to the lens body 21 by engaging the protrusions 21a of the lens body 21 with the engagement holes 26e of the lens cover 26, resulting in a reduction in the number of parts.

To the human body detecting sensor 107 mounted on the printed board 27 is attached a generally cylindrical reflecting member 30 having a chrome plated reflecting face 30a. The reflecting member 30 is attached to the printed board 27 by inserting a projection (not shown) formed on a lower edge thereof into a hole (not shown) formed in the printed board 27. When heat rays are incident on the lens 23 from the outside, a part of the incident heat rays is reflected by the reflecting face 30a of the reflecting member 30 and is incident on the human body detecting sensor 107. Therefore, a person moving along a working face such as a wall surface can be detected using the lens 23, the reflecting member 30 and the like in the automatic gang switch having a heat ray sensor, and the detection range in the horizontal direction of the automatic gang switch can be set to approximately 180 degrees. Conventionally, the detection range in the horizontal direction of the human body detecting sensor has been set to approximately 90 degrees. Therefore, a rotor accommodating the human body detecting sensor has been rotatably attached to the apparatus to adjust the detection region. For this reason, it has been necessary to keep a space for accommodating a rotating mechanism for the rotor. In the present embodiment, however, because heat rays incident on the lens 23 are reflected by the reflecting member 30, the detection range in the horizontal direction is enlarged to, for example, approximately 180 degrees. Thus, it is not necessary to provide the rotating mechanism for the rotor, unlike the conventional automatic gang switch. As a result, the size of the housing 1 can be reduced.

In order to prevent malfunction due to heat rays incident from an unnecessary region, a pair of area limiting covers (detection region limiting covers) 43 and 43 having shielding properties for limiting the detection region of the heat rays are slidably attached along the periphery of the cover support frames 24 on the front face of the lens cover 26, and are interposed between the cover 3 and the lens body 21. The area limiting covers 43 transmit visible light and are formed of a material for blocking the heat rays (for example, polycarbonate or the like). Therefore, it is possible to block only the incidence of the heat rays from the unnecessary region without decreasing the light incident on the brightness sensor 108 provided in the lens 23.

As shown in FIGS. 9A to 9D, each area limiting cover 43 is generally rectangular and has an arcuated cross-section. The area limiting cover 43 has a plurality of projections 43a integrally formed therewith at the four corners thereof and held in abutment with the surfaces of the cover support frames 24, and also has two projections 43b integrally formed therewith on respective sides thereof and held in abutment with the back faces of the covering members 29. The area limiting cover 43 further has an operation knob 43c integrally formed therewith at one end portion thereof for use in opening and closing the area limiting cover 43.

Figure 10:
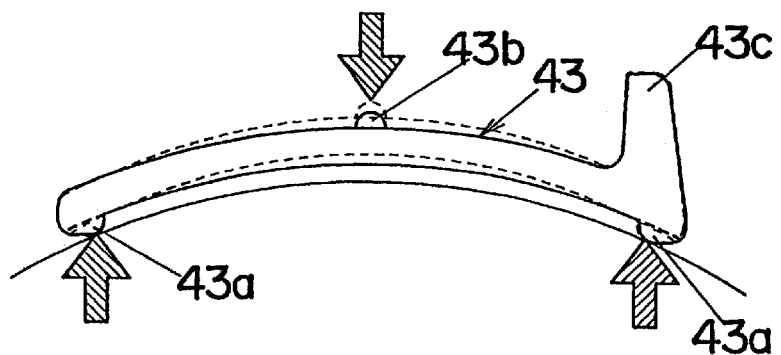
FIG. 10 is a bottom plan view of the area limiting cover, particularly illustrating a state in which the area limiting cover has been mounted.
Figure 11:
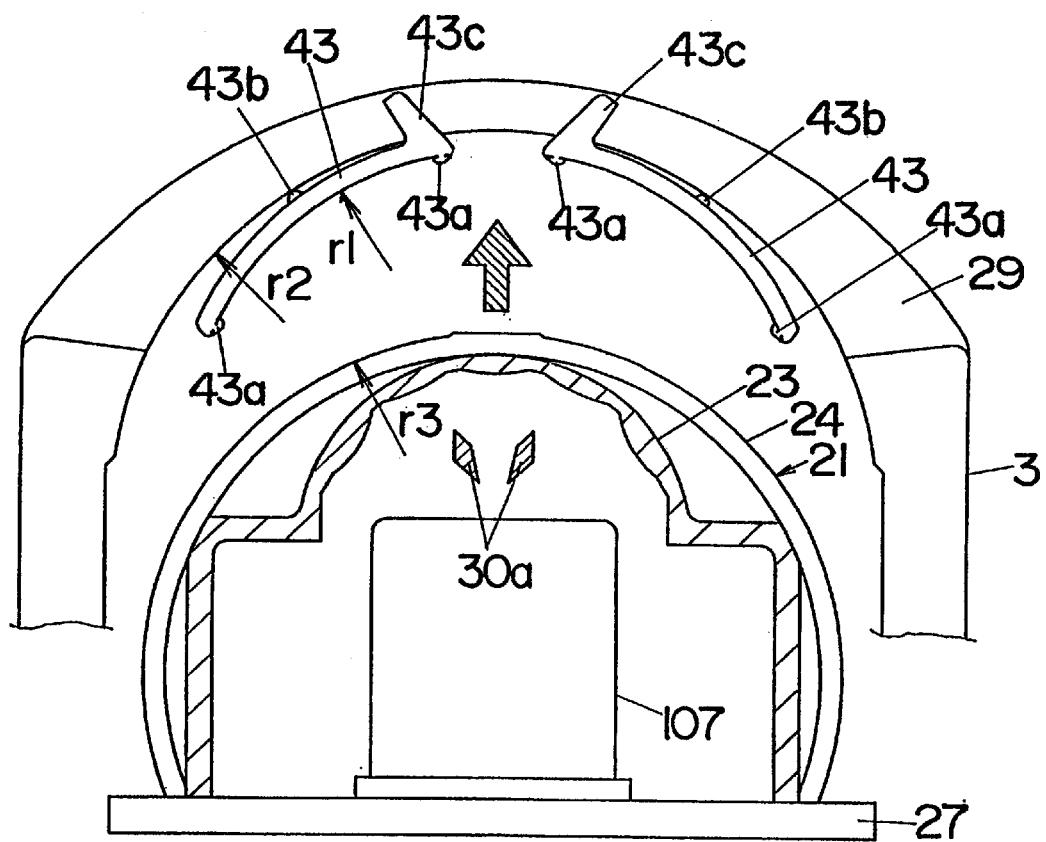
FIG. 11 is a bottom plan view, partly in section, of the lens body when the area limiting covers are being sandwiched between covering members and cover support members.

As shown in FIG. 11, the area limiting cover 43 has an arcuated cross-section and also has a radius r1 which is smaller than a radius r3 of the outer peripheral faces of the cover support frames 24 and a radius r2 of the inner peripheral faces of the covering members 29 (r2, r3>r1). Accordingly, when the area limiting cover 42 is interposed between the inner peripheral faces of the covering members 29 and the outer peripheral faces of the cover support frames 24, a downward force is applied to the projection 43b abutting on the inner peripheral faces of the covering members 29 and an upward force is applied to the projection 43a abutting on the outer peripheral faces of the cover support frames 24, as shown in FIG. 10. As a result, the contact pressure of the projections 43a of the area limiting cover 43 with the outer peripheral faces of the cover support frames 24 and that of the projections 43b with the inner peripheral faces of the covering members 29 increase, making it possible to prevent the area limiting cover 43 from moving due to vibration or an erroneous contact of the human body with the area limiting cover 43. Moreover, because the area limiting cover 43 is attached in a deformed state, it is possible to absorb a shift during assembling and a variation in the dimensions of parts, and the touch during the sliding operation of the area limiting cover 43 can be stabilized. A broken line in FIG. 10 shows the shape of the area limiting cover 43 to which no outer forces are applied.

Figure 12:
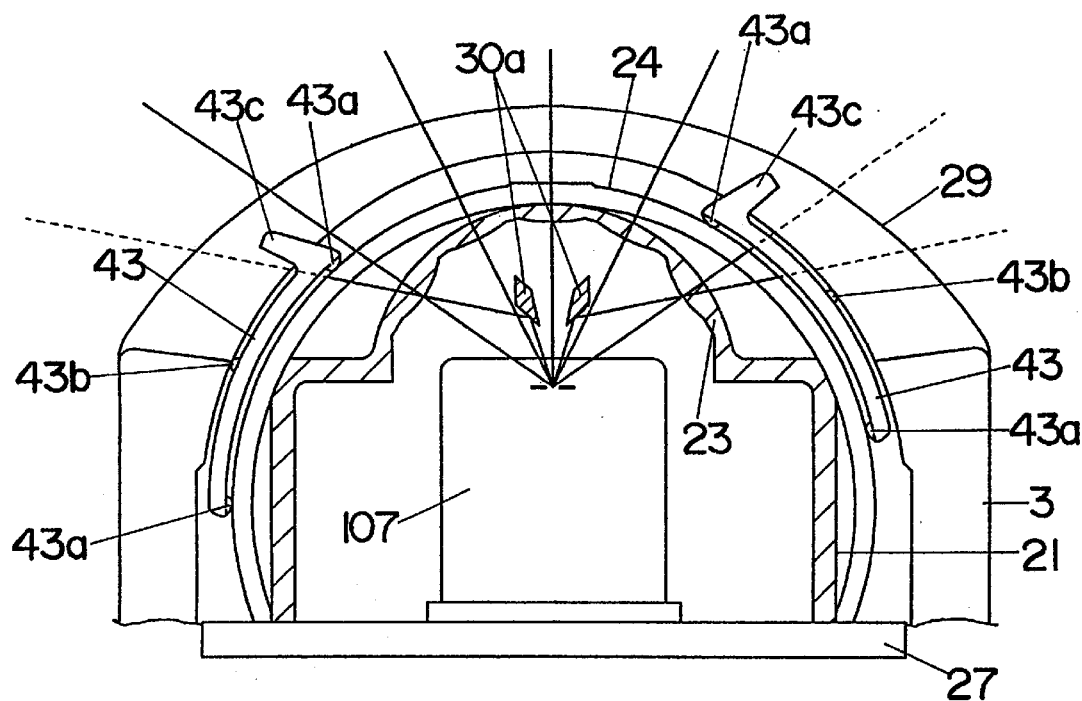
FIG. 12 is a bottom plan view, partly in section, of the lens body, particularly illustrating a state in which the area limiting covers are limiting a detection region.
Figure 13:
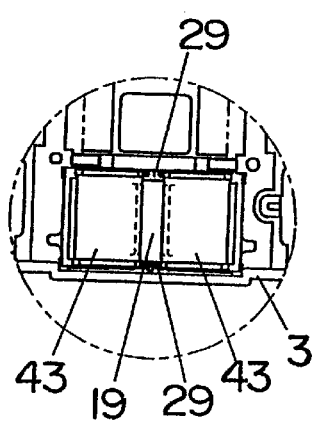
FIG. 13 is a rear view of the area limiting covers incorporated in the covering members.

As described above, because the reflecting member 30 is attached to the human body detecting sensor 107, heat rays incident on the same lens face of the lens 23 in a plurality of directions can be collected on the human body detecting sensor 107. However, in the case where the area limiting cover 43 is attached in close contact with the surface of the lens 23, all the heat rays incident on the same lens face of the lens 23 from a plurality of directions are shielded by the area limiting cover 43. In the present embodiment, however, because the area limiting cover 43 is attached to the surface of the lens 23 with a clearance therebetween, the heat rays incident on the same lens face of the lens 23 from a plurality of directions can be shielded separately, as shown in FIG. 12. If only heat rays from one direction is incident on one lens face of the lens 23, the area limiting cover 43 may be attached in close contact with the surface of the lens 23.

If the detection region does not need to be limited, the area limiting covers 43 and 43 are accommodated in the cover 3. If the detection region is to be limited, the operation knob 43c is operated to draw the area limiting cover 43 from the cover 3 along the peripheral faces of the cover support frames 24. In the conventional automatic gang switches having a heat ray sensor, a seal having shielding properties is stuck to the lens to limit the detection region. In the present embodiment, however, because the area limiting cover 43 is slidably attached, not only can the detection region be adjusted more easily than the case in which a seal is stuck, but the slidable area limiting cover 43 can also easily cope with a change in the detection region. In the case where only the detection region in the direction from the front of the automatic gang switch is limited, a shielding member (not shown) for shielding heat rays from the predetermined region may be attached to the front of the lens cover 26 later.

Figure 14:
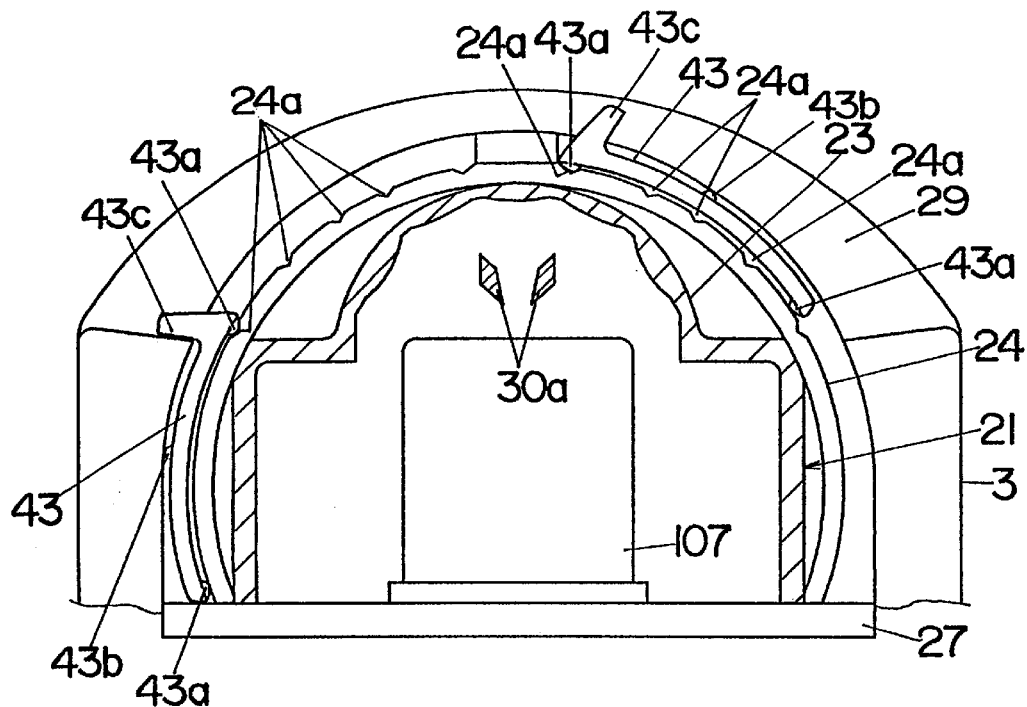
FIG. 14 is a view similar to FIG. 12, but illustrating a modification thereof.
Figure 15:
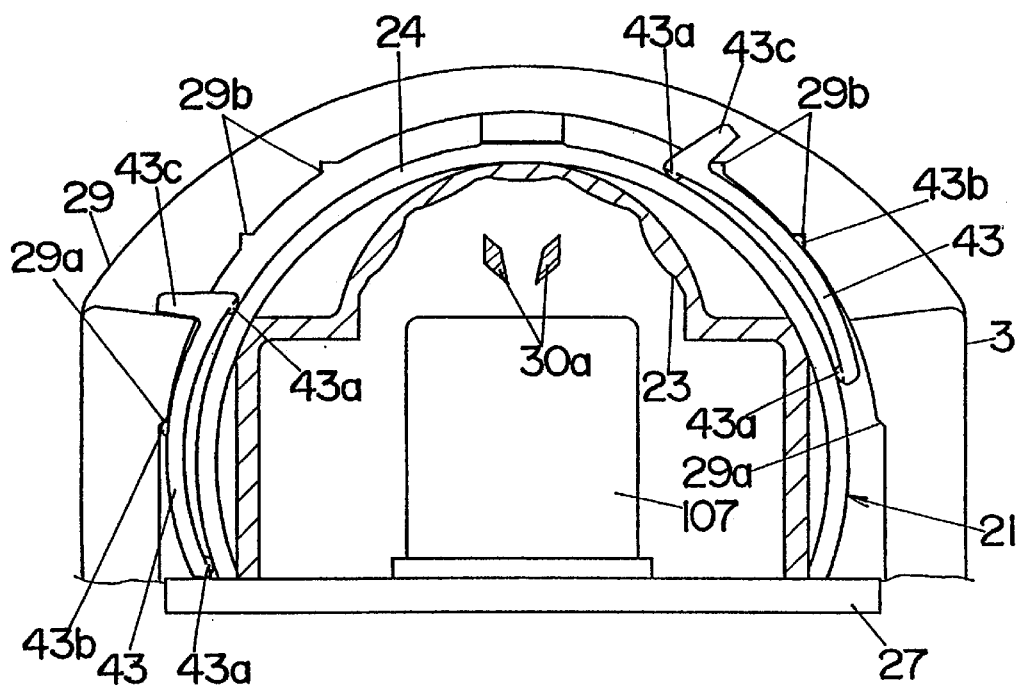
FIG. 15 is a view similar to FIG. 12, but illustrating another modification thereof.

As shown in FIG. 14, each cover support frame 24 may have a plurality of grooves 24a defined therein for engagement with the projections 43a of the area limiting cover 43. When the area limiting cover 43 is caused to slide, the projections 43a are engaged with the grooves 24a, resulting in generation of a feeling of click and making it possible to easily adjust the position of the area limiting cover 43. As shown in FIG. 15, stepped portions 29a to be engaged with the projections 43b of the area limiting cover 43 and grooves 29b may be formed on the inner peripheral faces of the covering members 29. When the area limiting cover 43 is caused top slide, the projections 43b are engaged with the stepped portions 29a or the grooves 29b, resulting in generation of a feeling of click and making it possible to easily adjust the position of the area limiting cover 43. As compared with the case in which the grooves 24a to be engaged with the projections 43a of the area limiting cover 43 are formed on the surface of the cover support frame 24, the amount of movement of the area limiting cover 43 moving in the direction in which the force is applied to the area limiting cover 43 is great by the pressing operation of the inner peripheral face of the covering member 29 on the projections 43b when the projections 43b are engaged with the stepped portions 29a or the grooves 29b. Consequently, it is possible to obtain a greater feeling of click.

Figure 16:
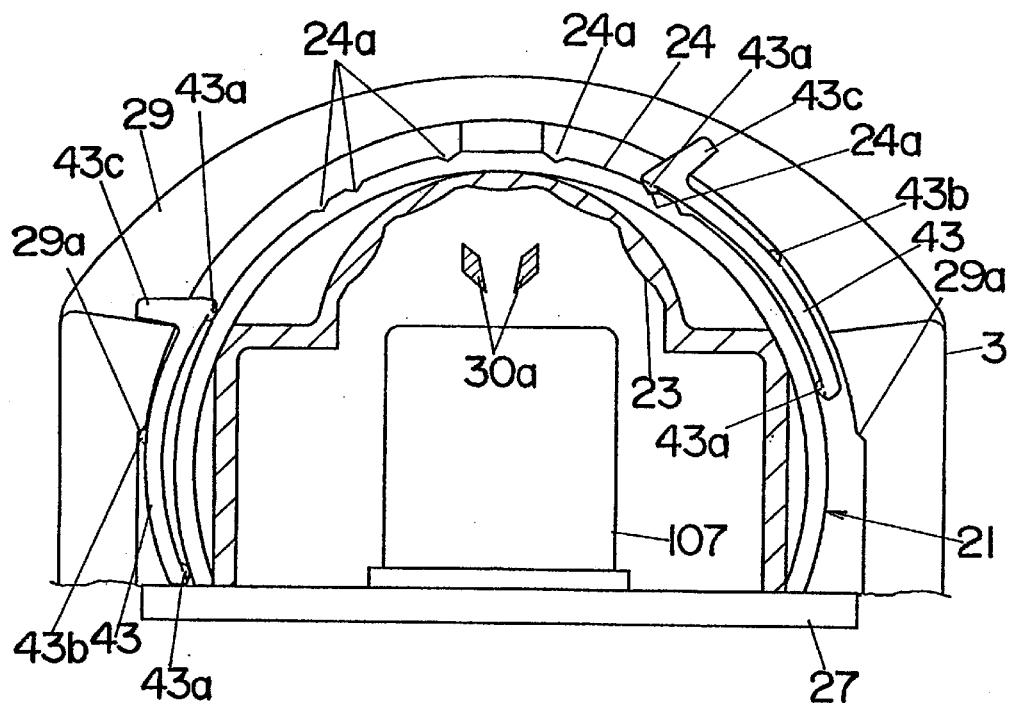
FIG. 16 is a view similar to FIG. 12, but illustrating a further modification thereof.

As shown in FIG. 16, the grooves 24a to be engaged with the projections 43a of the area limiting cover 43 may be formed on the surface of the cover support frames 24, and the stepped portions 29a to be engaged with the projections 43b of the area limiting cover 43 may be formed on the inner peripheral faces of the covering members 29 with the area limiting cover 43 accommodated in the cover 3. If any grooves are not formed on the covering members 29 which can be seen from the outside but the grooves 24a are formed on the surfaces of the cover support frames 24 for the generation of the feeling of click, the appearance of the switch can be enhanced. Moreover, if the stepped portions 29a are formed on the covering members 29 which cannot be seen from the outside, when the area limiting cover 43 is accommodated in the cover 3, the projections 43b are engaged with the stepped portions 29a. Therefore, it is possible to prevent the area limiting cover 43 from sliding due to an erroneous touch, vibration or the like. Thus, the area limiting cover 43 can reliably be accommodated in the cover 3.

Figure 17:
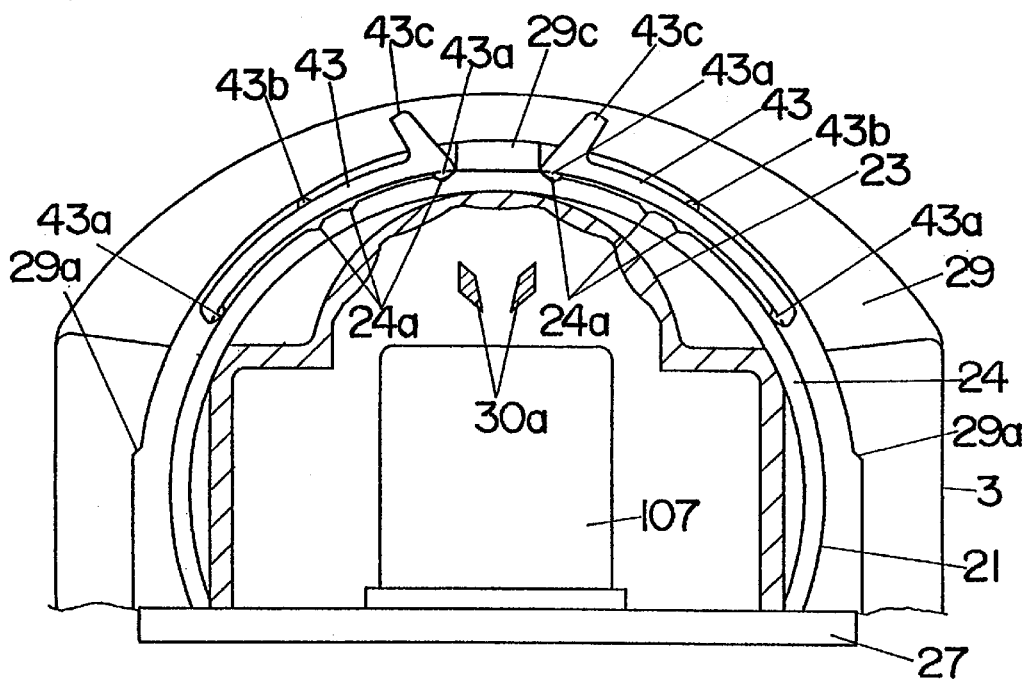
FIG. 17 is a view similar to FIG. 12, but illustrating a still further modification thereof.
Figure 18:
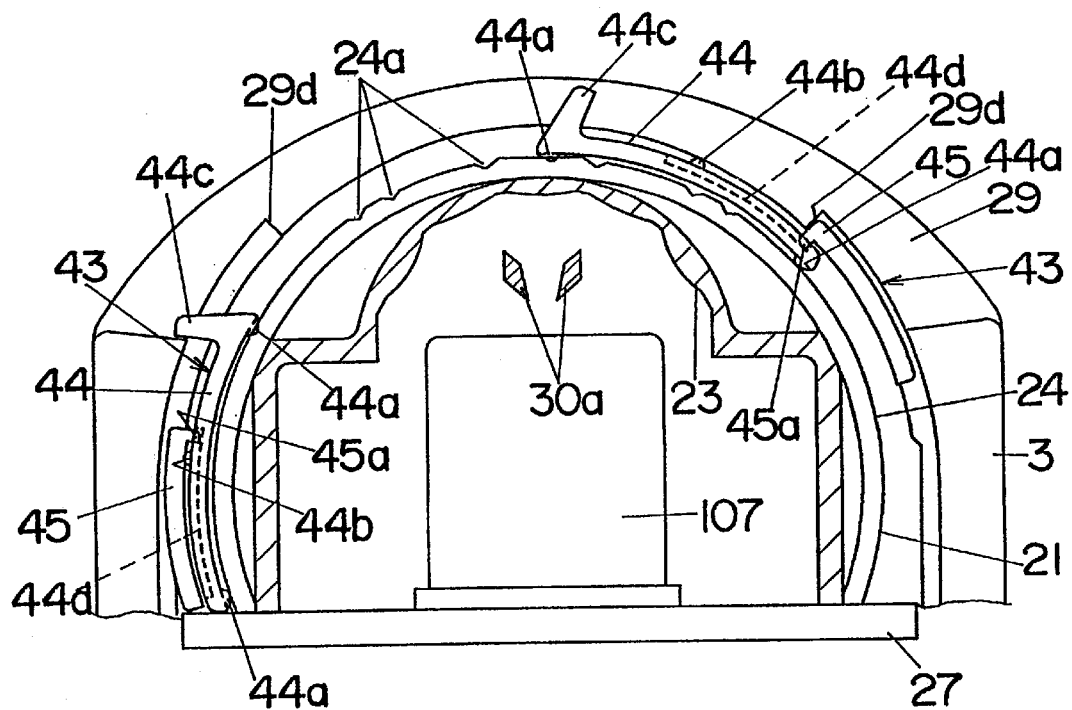
FIG. 18 is a view similar to FIG. 12, but illustrating another modification thereof.

As shown in FIG. 17, the covering member 29 may have a stopper 29c formed therewith substantially at a center thereof for controlling the sliding operation of the area limiting cover 43. When the area limiting cover 43 is caused to slide, it abuts against the stopper 29c and cannot slide any more, making it possible to maintain at least a part of the detection region. Accordingly, the area limiting cover 43 can be prevented from being closed by mischief, which may cause the detection region of the human body detecting sensor 107 to be entirely shielded, resulting in no detection.

Although in the above-described embodiment each area limiting cover 43 is formed of one plate, the area limiting cover 43 may be formed of a plurality of (for example, two) generally rectangular doors (plates) 44 and 45 having an arcuated cross-section. Because the size of each door 44 and 45 can be reduced, the space for accommodating the area limiting cover 43 can be further reduced, compared with the case in which the area limiting cover 43 is formed of one plate. The two doors 44 and 45 are interposed between the cover 3 and the lens body 21 with the door 44 disposed on the back side and the door 45 disposed on the front side. The door 44 has projections 44a formed therewith at the four corners thereof to abut on the surfaces of the cover support frames 24, and also has projections 44b formed therewith on respective sides thereof. An operation knob 44c for carrying out an opening and closing operation is formed on one end of the door 44 so as to extend outwardly therefrom. On the other hand, the door 45 has a projection 45a formed therewith for engagement with a groove 44d formed in the door 44 in the circumferential direction thereof.

When the door 44 accommodated in the cover 3 is drawn out by using the operation knob 44c, the rear edge of the groove 44d is engaged with the projection 45a and, hence, the door 45 is drawn together with the door 44, thus limiting the detection region of the human body detecting sensor 107. On the other hand, when the doors 44 and 45 are to be accommodated in the cover 3, the door 44 is moved into the cover 3 by means of the operation knob 44c. As a result, the projections 44b of the door 44 are engaged with the door 45 to move the door 45 together therewith until the doors 44 and 45 are both accommodated within the cover 3. The radius of the cross-section of the door 44 is smaller than each of the radius r3 of the outer peripheral faces of the cover support frames 24 and the radius r2 of the inner peripheral faces of the covering members 29. Accordingly, in the same manner as described above, when the door 44 is interposed between the inner peripheral faces of the covering members 29 and the outer peripheral faces of the cover support frames 24, the contact pressure of the projections 44a with the outer peripheral faces of the cover support frames 24 and the contact pressure of the projections 44b with the inner peripheral faces of the covering members 29 increase, making it possible to prevent the door 44 from moving due to vibration or an erroneous contact of the human body with the door 44. Each covering member 29 has a stepped portion 29d formed on the inner face thereof for controlling the movement of the door 45. Abutment of the door 45 against the stepped portion 29d limits or restricts the range of movement of the doors 44 and 45.

Figure 19:
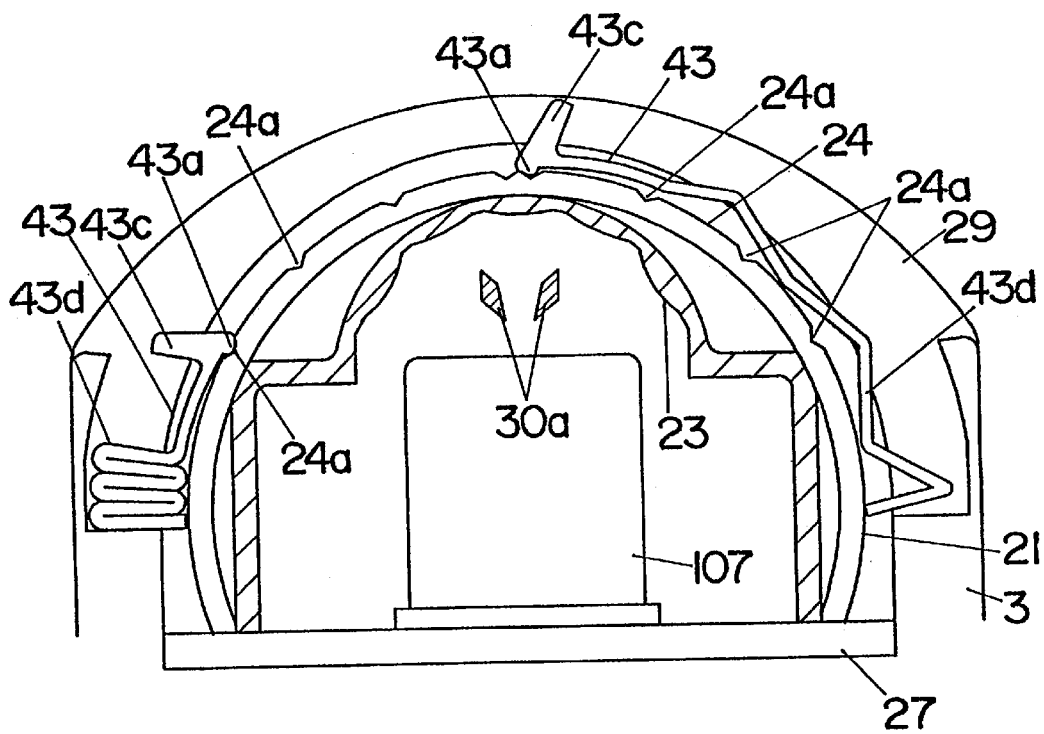
FIG. 19 is a view similar to FIG. 12, but illustrating a further modification thereof.

As shown in FIG. 19, the area limiting cover 43 may have a bellows-type flexible portion 43d that expands or contracts according to the position of the area limiting cover 43. In this case, the space for accommodating the area limiting cover 43 can be considerably reduced, compared with the case in which the area limiting cover 43 is formed of one plate.

In the conventional automatic gang switches having a heat ray sensor, that portion of the housing 1 on which a detecting section including the human body detecting sensor 107 and the like is placed has a curved shape protruding forwardly, while that portion of the housing 1 on which the mode change-over switch SW1 and the switches SW2 and SW3 are placed is formed generally flat, thus deteriorating the appearance. Furthermore, because the operation knob 32 of the mode change-over switch SW1 is relatively small, a difficulty is encountered in operating it and in finding out the current position thereof.

In the present embodiment, an operating handle 33 is attached to the operating knob 32 of the mode change-over switch SW1, and a knob 33a of the operating handle 33 protrudes forwardly from the opening 18 of the cover 3. For a change of the operation mode, the change-over operation of the operating knob 32 of the mode change-over switch SW1 can be carried out by operating the operating handle 33. Furthermore, the size of the operating handle 33 is greater than that of the operating knob 32 of the mode change-over switch SW1, enhancing the operability. On the other hand, the operating knobs 35 and 36 of the switches SW2 and SW3 mounted on the printed board 27 protrude forwardly from respective openings 13 and 14 in the cover 3, and a lever 37 is attached to the operating knob 36 of the switch SW3.

Figure 20A:
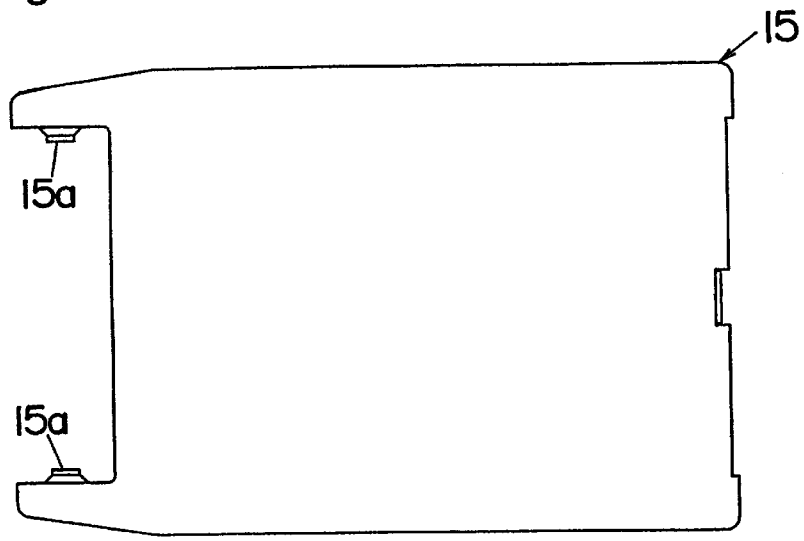
FIG. 20A is a front view of a door mounted on the automatic gang switch of FIG. 1.
Figure 20B:
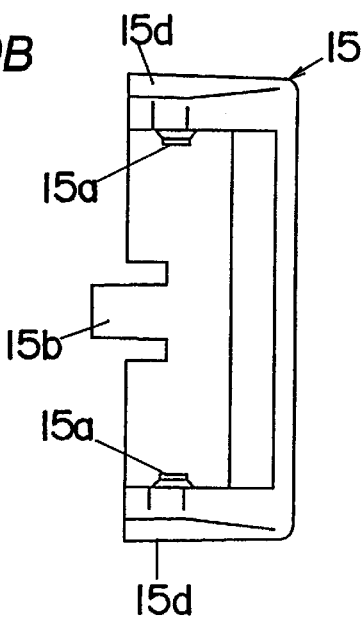
FIG. 20B is a side view of the door.
Figure 20C:
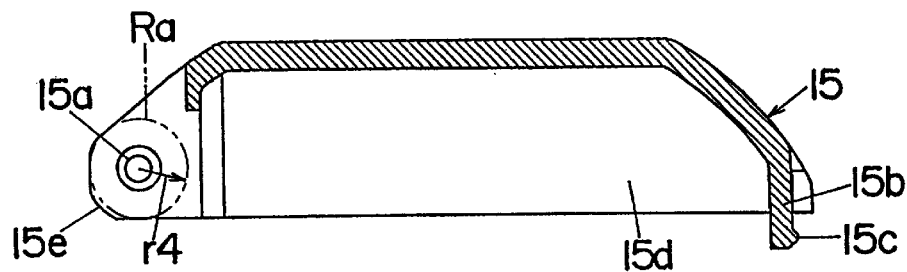
FIG. 20C is a bottom plan view, partly in section, of the door.
Figure 21A:
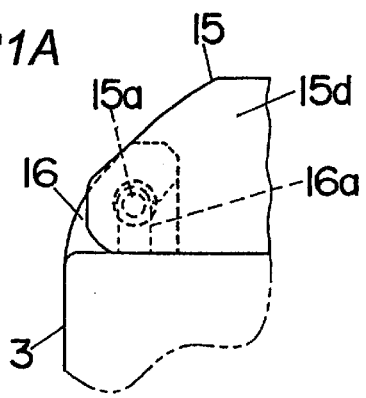
FIGS. 21A to 21G are top plan views of the door when the door is being opened.
Figure 21B:
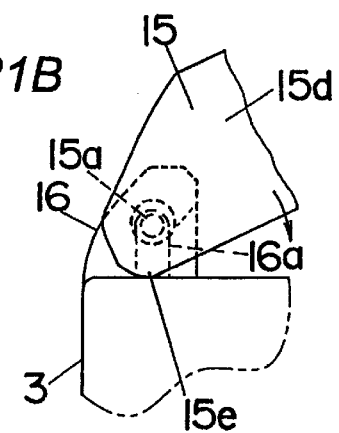
Figure 21C:
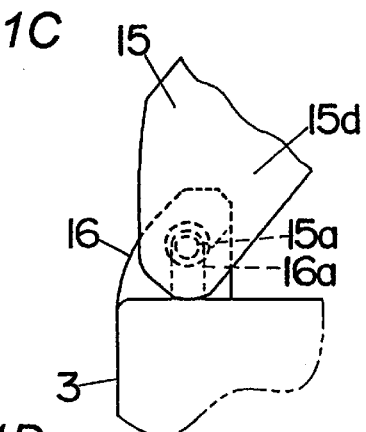
Figure 21D:
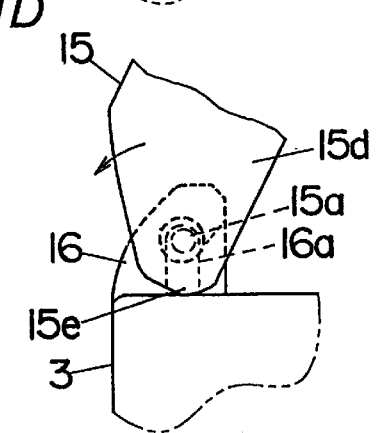
Figure 21E:
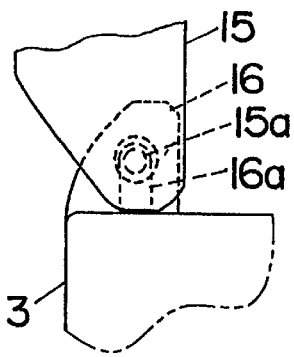
Figure 21F:
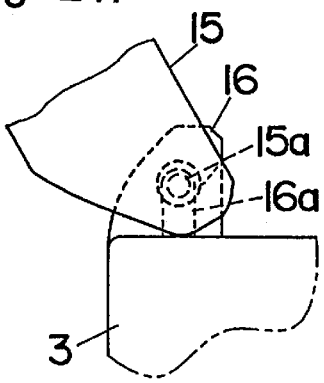
Figure 21G:
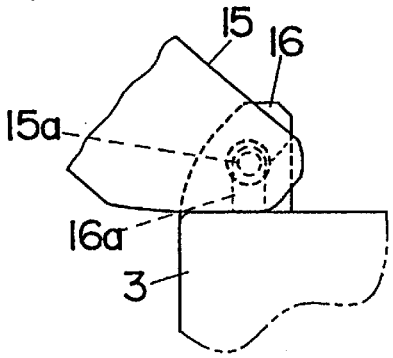

The depression 12 in which the switches SW2 and SW3 are positioned has a cover or door 15 pivotally mounted thereon. As shown in FIGS. 20A to 20C, the door 15 has a curved surface protruding forwardly from the depression 12, and also has generally semicircular side walls 15d and 15d opposed to each other. Each side wall 15d has a shaft 15a integrally formed therewith on one side thereof and extending laterally inwardly therefrom, which is loosely inserted in a hole 16a defined in the bearing member 16 on the cover 3. The shaft 15a is provided with a generally cylindrical distal end portion having a constant diameter and a frusto-conical proximal end portion having an increasing diameter toward the side wall 15d. Moreover, the door 15 has an elastic engagement piece 15b integrally formed therewith and protruding toward the back face side at a location corresponding to the opening 17 of the cover 3, and a projection 15c is formed with a distal end of the engagement piece 15b so as to protrude laterally outwardly.

Figure 22:
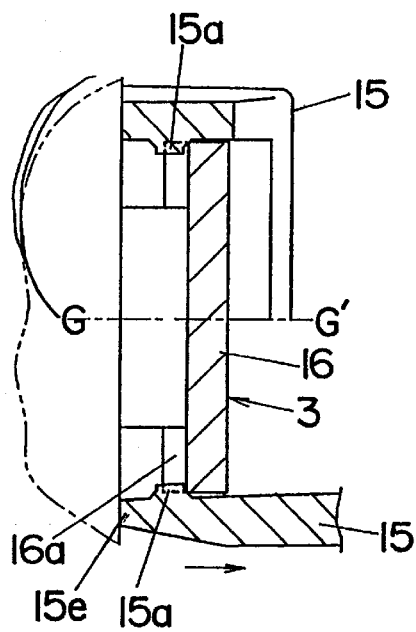
FIG. 22 is a cross-sectional view of the door, illustrating a state in which the door is closed and another state in which the door is slightly opened.

As shown in FIGS. 21A to 21G and FIG. 22, the door 15 is pivotally mounted on the front face of the cover 3 by the engagement of the shafts 15a with the holes 16a of the bearing member 16. The upper side from the line G–G' in FIG. 22 shows a state in which the door 15 is closed, and the lower side from the line G–G' shows a state in which the door 15 is opened to a position illustrated in FIG. 21C.

In the case where a distance between the center of the shaft 15a and the surface of the cover 3 is set to r4 and a circle Ra having a radius r4 is drawn with the shaft 15a as a center (as shown by a double dotted chain line in FIG. 20C), the side wall 15d has such a shape that an edge 15e of the side wall 15d opposed to the cover 3 protrudes outwardly from the circle Ra. That is, the distance between the edge 15e of the side wall 15d and the center of the shaft 15a is greater than the radius r4. Accordingly, when the door 15 is rotated counterclockwise to a position shown in FIG. 21B under the condition in which the door 15 is closed (see FIG. 21A), the edge 15e of the side wall 15d comes in contact with the surface of the cover 3 so that a force is applied to the door 15 in the direction of an arrow in FIG. 22. At this time, the side wall 15d of the door 15 is pushed and bent outwardly, and the contact position of the shaft 15a with the bearing member 16 is moved to the cylindrical distal end portion of the shaft 15a, thus generating a force that acts to close the door 15. When the door 15 is further rotated counterclockwise to a position shown in FIGS. 21D, a force that acts to open the door 15 is generated so that the door 15 is brought into a full open state (see FIG. 21G).

Under the condition in which the door 15 is completely opened, the surface of the cover 3 is not in contact with the side wall 15d so that such a force as to bend the side wall 15d outwardly is not generated. Accordingly, when the door 15 is to be closed in the completely open state, the edge 15e of the side wall 15d comes in contact with the surface of the cover 3 so that such a force as to bend the side wall 15d outwardly is generated. Because this force acts to open the door 15, the door 15 is not closed by a mere erroneous touch with the door 15. Therefore, the door 15 is not closed unexpectedly to disturb the operation of the switches SW2 and SW3 when the door 15 is open. Moreover, because the shaft 15a has the frusto-conical proximal end portion, even if the door 15 is further opened from the full open state, the side wall 15d is bent outwardly so that the shaft 15a is disengaged from the bearing member 16. The shaft 15a is not broken and, hence, the door 15 can be attached again.

On the other hand, in the case where the door 15 is closed, when the door 15 is rotated clockwise in FIG. 22, the engagement piece 15b protruding from the door 15 is inserted into the hole 17. Consequently, the projection 15c impinges on the end face of the hole 17, and the engagement piece 15b is pushed and bent inwardly. As a result, the projection 15c is engaged with the inner face of the cover 3 beyond the end face of the hole 17. Thus, the door 15 is latched in a closed state. When the door 15 is rotated counterclockwise in FIG. 22 in the state in which the door 15 is closed, the projection 15c similarly impinges on the end face of the hole 17, and the engagement piece 15b is pushed and bent inwardly. Consequently, the projection 15c gets beyond the end face of the hole 17 so that the projection 15c is disengaged from the inner face of the cover 3. Thus, the door 15 can be opened easily.

As described above, because the portion of the cover 3 where the switches SW2 and SW3 are provided are covered with the door 15, it is possible to prevent the switches SW2 and SW3 from being operated carelessly. Moreover, the surface of the door 15 is formed to have a curved shape similar to the shape of the surface of that portion of the cover 3 in which the human body detecting sensor 107 is provided. Therefore, the appearance is improved and the space within the door 15 is increased. As a result, the lever 37 can be fixed to the operating knob 36 of the switch SW3 and the operability of the switch SW3 can be enhanced.

In the present embodiment, the human body detecting sensor 107, the mode change-over switch SW1, and switches SW2 and SW3 are provided on the front face of the housing 1 with the housing 1 attached to a working or building face. Therefore, various setting operations can easily be carried out from the front face side of the housing 1. Moreover, the human body detecting sensor 107 and the brightness sensor 108 are provided on a lower portion of the housing 1, the mode change-over switch SW1 is provided at the center of the housing 1, and the switches SW2 and SW3 are provided on an upper portion of the housing 1. Because the heating elements and the human body detecting sensor 107 are accommodated in the housing 1 as distant as possible, the human body detecting sensor 107 is rarely affected by heat generated in the apparatus. Furthermore, because the human body detecting sensor 107 is provided on the lower portion of the housing 1, not only can the influence of heat directly radiated from the heating elements be reduced, but the influence of heat circulating in the housing 1 can also be reduced.

In the present embodiment, the housing 1 comprised of the body 2 and the cover 3 has such a size as to be attached to a ready-made mounting frame standardized for a flush type wiring device such that it can be embedded in a building face such, for example, as a vertical wall surface. Such mounting frames include frames for large rectangular ganged wiring devices standardized by JIS (Japanese Industrial Standard), for example (see JISC8375). In the present embodiment, the longitudinal size (length) of the housing 1 is determined to be approximately two thirds (the size of double modules) of that of a generally rectangular opening of the mounting frames for the large rectangular ganged wiring devices, while the width of the housing 1 is determined to be approximately equal to that of the generally rectangular opening of the mounting frames.

Figure 24A:
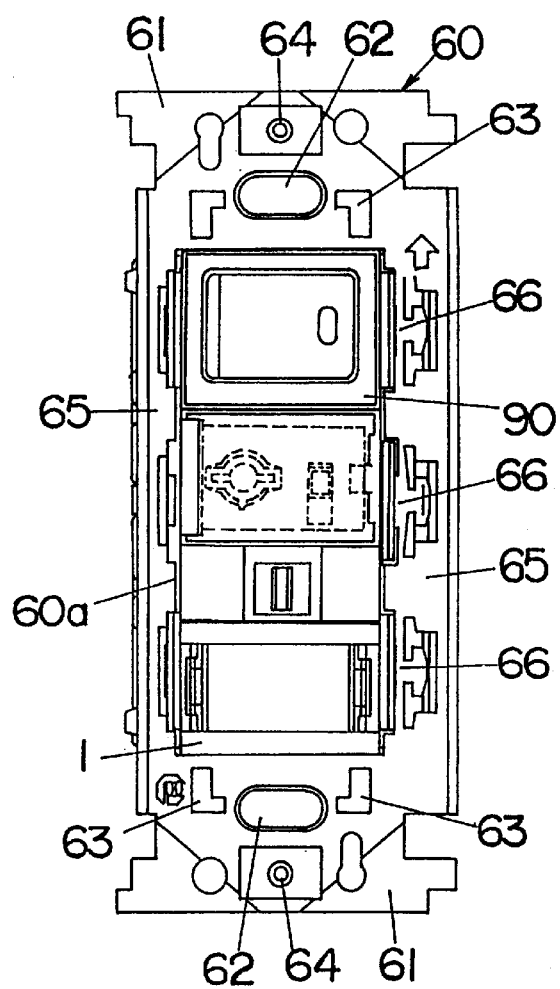
FIG. 24A is a front view of a switch assembly in which the automatic gang switch of FIG. 1 is incorporated.
Figure 24B:
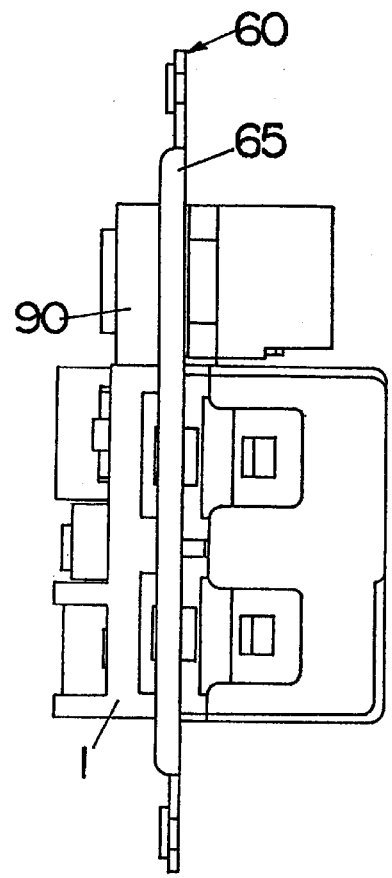

FIG. 24 depicts a switch assembly, which includes an automatic gang switch having a heat ray sensor and a housing 1 having a size of double modules, a switch 90 juxtaposed with the automatic gang switch and having a size of single module, and a metallic mounting frame 60 on which the switches are mounted. Both of the switches are intended for large rectangular ganged wiring devices. The mounting frame 60 is a generally rectangular frame having a generally rectangular opening 60a formed at a center thereof. The mounting frame 60 also has two end mounting portions 61 and 61 formed at opposite ends in the longitudinal direction thereof. Each end mounting portion 61 has an elongated opening 62 for insertion of a screw for attaching a flush type box (not shown), generally L-shaped openings 63 through which a well-known attachment plate (not shown) is fixed for attachment to a plaster board forming a wall, and a screw hole 64 for insertion of a screw for attaching a plate frame (not shown) or the like on the front face. The mounting frame 60 also has two side mounting portions 65 and 65 formed on respective sides of the generally rectangular opening 60a. Each side mounting portion 65 is provided with a plurality of stationary claw pieces (not shown) and a plurality of movable claw pieces 66.

By the above-described construction, the housing 1 can easily be attached to the mounting frame 60 by inserting one of the stationary claw pieces into a coupling recess 11 of the cover 3 and by subsequently inserting one of the movable claw pieces 66 into the other coupling recess 11 to engage the former with the latter. In this way, when the housing 1 is attached to the mounting frame 60 having a size of triple modules, another wiring device (large rectangular ganged wiring device) such as a switch 90, a plug socket, a modular jack or the like can be mounted in the remaining space of a size of single module in the mounting frame 60 because the housing 1 is of a size of double modules.

FIG. 25 depicts a switch assembly, which includes an automatic gang switch having a heat ray sensor, a switch 90 juxtaposed with the automatic gang switch, and a mounting frame 70 made of a synthetic resin on which the switches are mounted. The mounting frame 70 has two end mounting portions 71 and 71 formed at opposite ends in the longitudinal direction thereof and two side mounting portions 75 and 76 formed on respective sides of a generally rectangular opening 70a. Each end mounting portion 71 has an elongated opening 72 for insertion of a screw for attaching a flush type box, openings (not shown) through which an attachment plate is fixed, and a screw hole 74 for insertion of a screw for attaching a plate frame. One 75 of the side mounting portions has three sets of two paired holes (not shown) defined therein in a side-by-side fashion, while the other side mounting portion 76 has an elongated plate 77 integrally formed therewith or otherwise secured thereto. The elongated plate 77 has three openings 79 defined therein at regular intervals and three engagement pieces 78 protruding forwardly from rear edges of the openings 79, respectively.

By the above-described construction, the housing 1 can be attached to the mounting frame 70 by first inserting one of the two paired claw pieces 10 into associated one of the openings 79 and by subsequently inserting the other claw piece 10 into the associated one opening 79 such that it may ride on a shoulder 80 of the engagement piece 78. In this case, the longitudinal size of the housing 1 is set to approximately two thirds of the size of the generally rectangular opening 70a of the mounting frame 70 (the size of double modules).

As shown by a double dotted chain line in FIG. 25, a plate 82 is attached to the front face of the mounting frame 70 made of a synthetic resin via a plate mounting frame 81. The plate 82 has an opening of a size greater than the size of the generally rectangular opening 70a of the mounting frame 70. Accordingly, a part of the mounting frame 70 is exposed from the opening of the plate 82 as it now stands. A decorative cover 83 for blocking a clearance between the opening of the plate 82 and the front face of the automatic gang switch is attached to the front face of the mounting frame 70. Consequently, it is possible to easily apply it to the plate 82 having a relatively large opening corresponding to wiring devices such as a so-called piano handle switch.

In FIGS. 24 and 25, the switch 90 is attached to the mounting frame 60 or 70 such that the former is disposed above the automatic gang switch having a heat ray sensor. In order not to cause the shadow of hands to enter the brightness sensor 108 during operation of the switch 90, the switch 90 may be disposed below the automatic gang switch.

Embodiment 2

Figure 31:
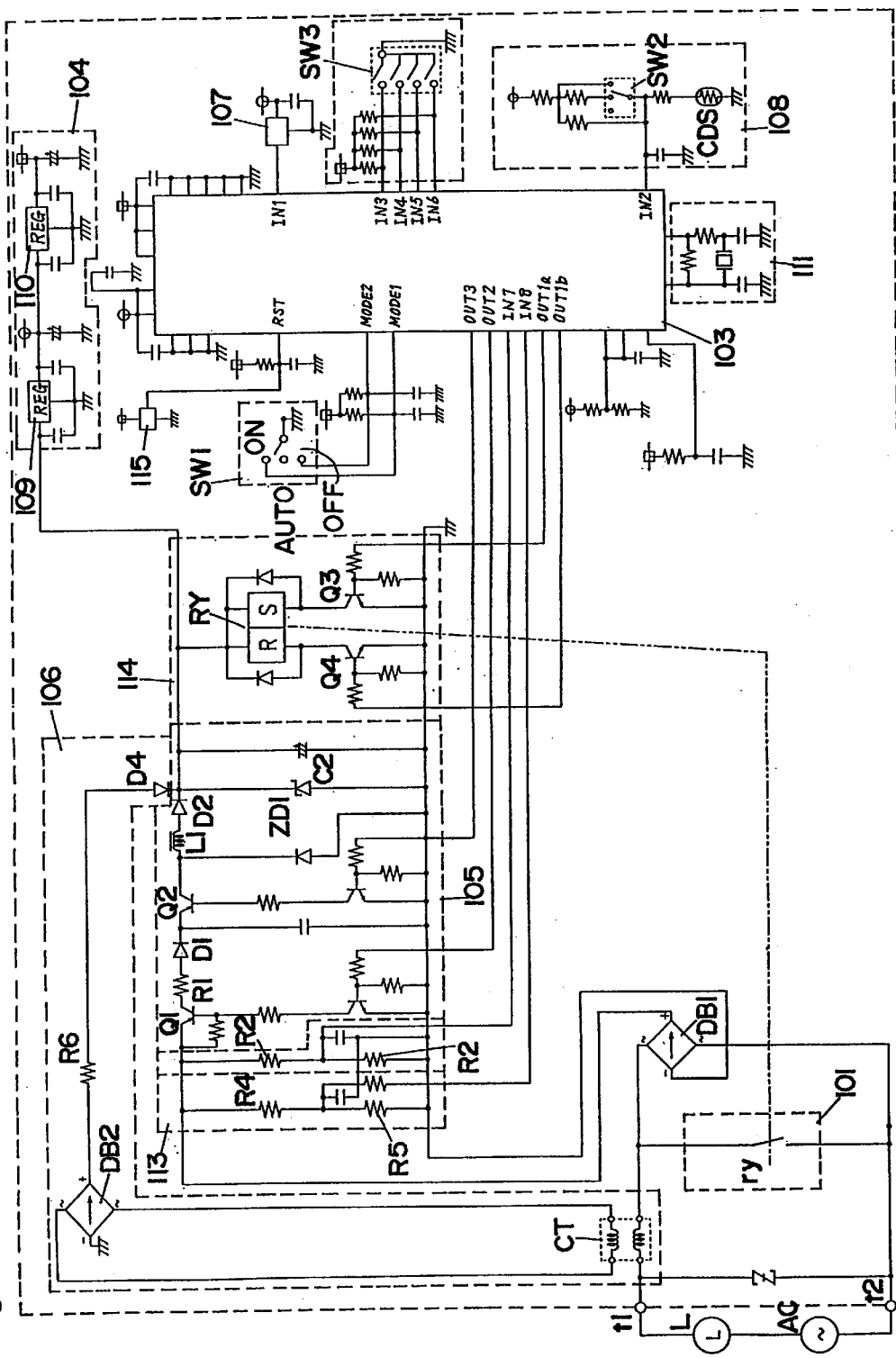
FIG. 31 is a diagram similar to FIG. 27, but illustrating an automatic gang switch having a heat ray sensor according to a second embodiment of the present invention.

FIG. 31 is a circuit diagram showing an automatic gang switch having a heat ray sensor according to a second embodiment of the present invention. While the load control circuit 101 having the triac TRC is connected between the connecting terminals t1 and t2 through the primary winding of the current transformer CT in the first embodiment, a relay RY of a latching type is used in which a contact state is changed over by energization to, for example, a set coil or a reset coil, in place of the triac TRC, and the contact state changed over by magnetic force or the like is held in the second embodiment. More specifically, in the automatic gang switch having a heat ray sensor according to the second embodiment, a relay contact ry is connected between connecting terminals t1 and t2 through a primary winding of a current transformer CT. In place of the driving circuit 102, a relay driving circuit 114 for opening or closing the relay RY is provided. Because the structures other than the relay contact ry and the relay driving circuit 114 are the same as those of the first embodiment described above, the like components have the like reference numerals and their description is omitted.

The relay driving circuit 114 includes a series circuit of a set coil S and a transistor Q3 which are connected between opposite ends of a capacitor C2 and a series circuit of a reset coil R and a transistor Q4. The transistors Q3 and Q4 are turned on and off in response to a signal output from output terminals OUT1a and OUT1b of a control IC, respectively.

Figure 32:
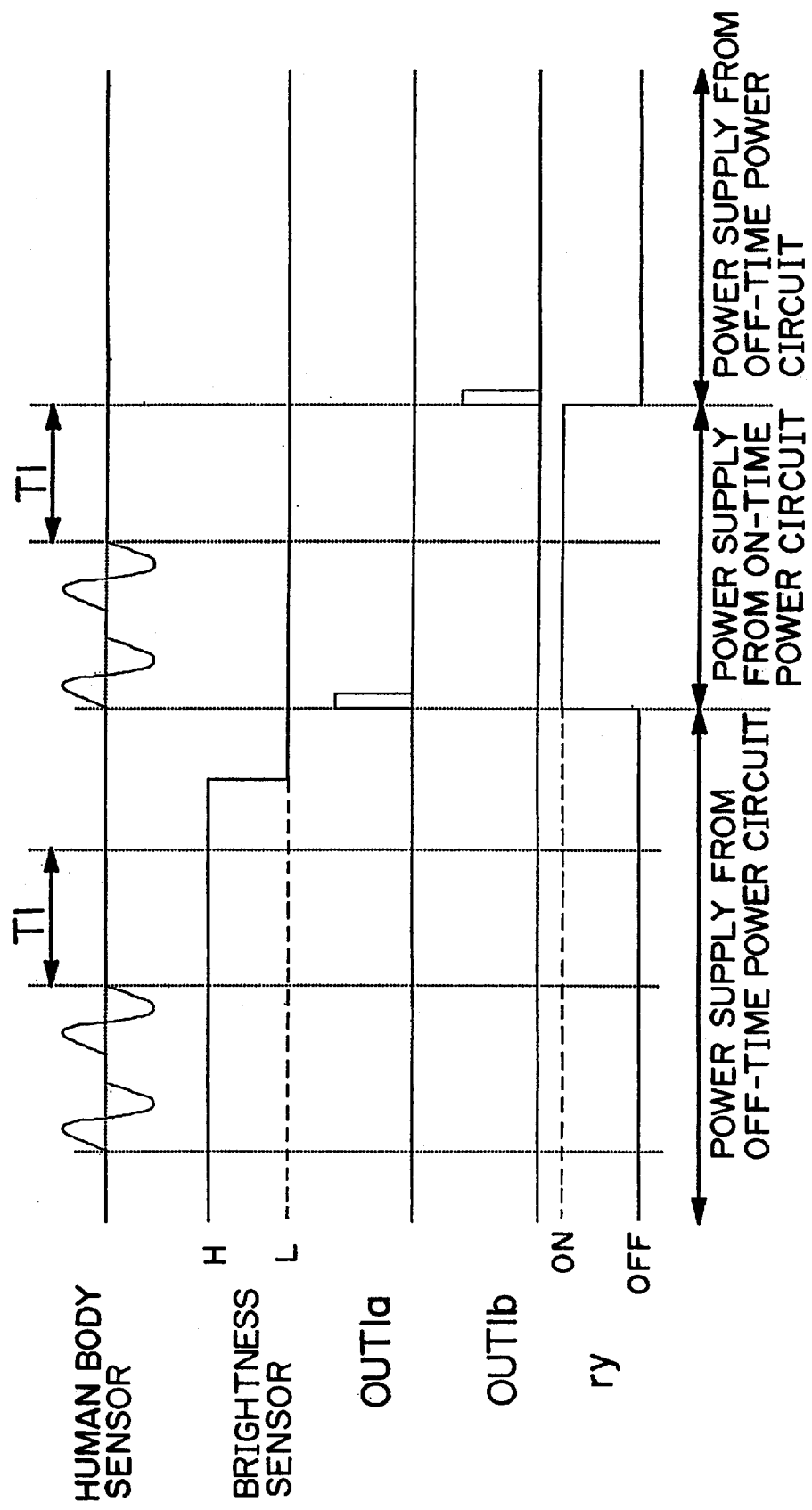
FIG. 32 is a chart similar to FIG. 30, but illustrating an operation of the automatic gang switch of FIG. 31.

The operation of the automatic gang switch having a heat ray sensor is described below with reference to a time chart shown in FIG. 32. If the detection signal of the brightness sensor 108 has the H level, that is, the brightness around it is greater than the predetermined threshold, the control IC 103 does not output a control signal to the relay driving circuit 114 even if a human body detection signal is input from a human body detecting sensor 107. On the other hand, in the case where the output signal of the brightness sensor 108 is set to the L level, that is, the brightness around it is smaller than the predetermined threshold, the control IC 103 outputs a signal for turning on the transistor Q3 from the output terminal OUT 1a to the relay driving circuit 114 if the human body detection signal is input from the human body detecting sensor 107. At this time, a current flows to the set coil S of the relay RY through the transistor Q3, the relay contact ry is turned on, and power is supplied to the load L. The relay RY is of a latching type. Therefore, even if energization to the set coil S is completed, the relay contact ry holds the on-state and the power is continuously supplied to the load L. Accordingly, it is not necessary to cause the current to continuously flow to the coil of the relay RY, thus resulting in energy saving.

The control IC 103 outputs a control signal to the relay driving circuit 114 based on the human body detection signal input from the human body detecting sensor 107. At the same time, in the case where the human body detection signal is input from the human body detecting sensor 107 within a predetermined operation holding time T1, the operation holding time T1 is reset. Consequently, the output time of the control signal, that is, the operation time of the load L is extended. When the time limit of the operation holding time T1 is over, the control IC 103 outputs a control signal for turning on the transistor Q4 from the output terminal OUT1b. At this time, a current flows to the reset coil R of the relay RY through the transistor Q4, the relay contact ry is turned off, and the power supply to the load L is stopped.

Thus, the load control circuit 114 is constituted by the relay contact ry in the present embodiment. Therefore, it is possible to further reduce heat that is generated by the circuit component parts as compared with the case in which a triac TRC is used.

Embodiment 3

Figure 33:
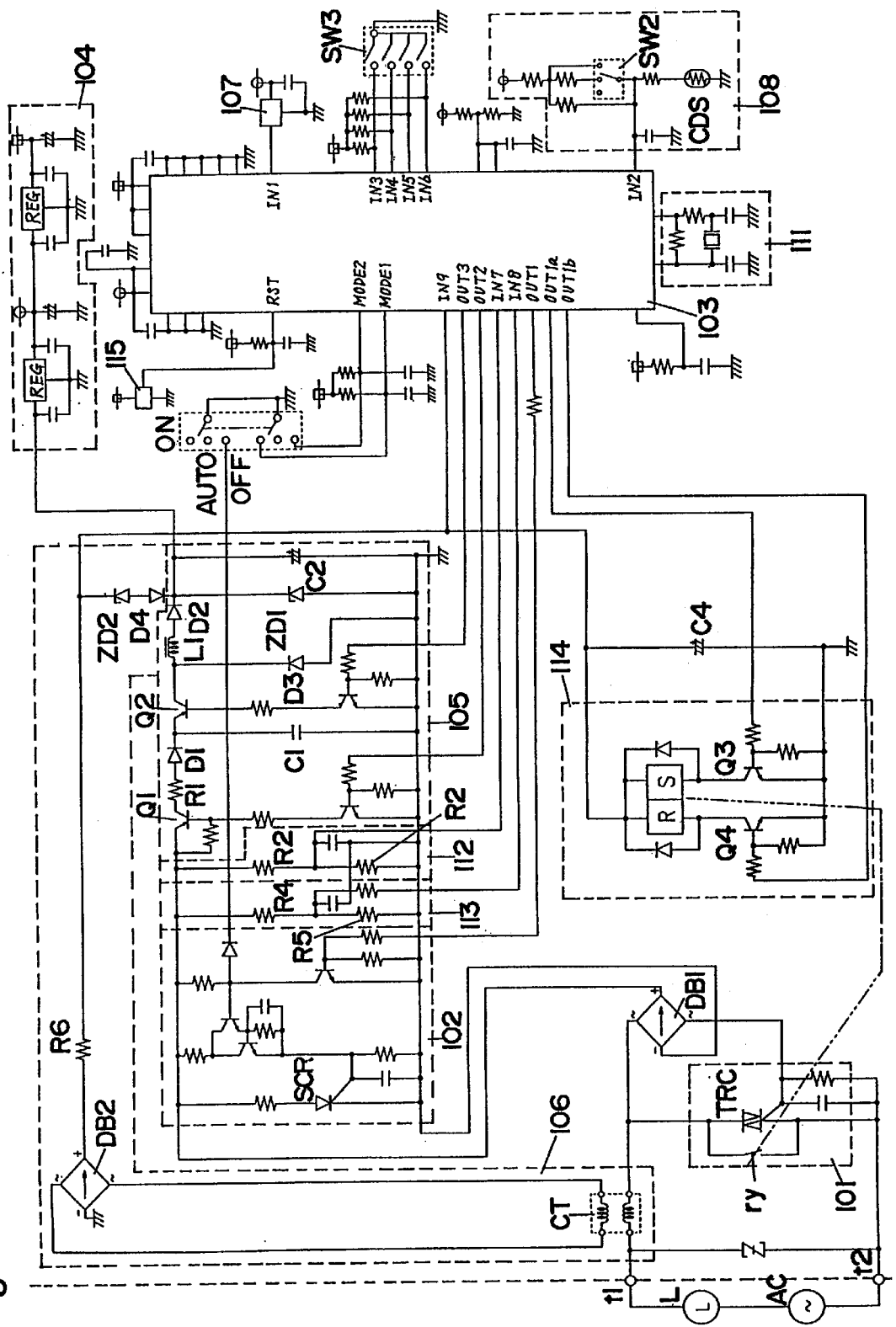
FIG. 33 is a diagram similar to FIG. 27, but illustrating an automatic gang switch having a heat ray sensor according to third embodiment of the present invention.

FIG. 33 is a circuit diagram showing an automatic gang switch having a heat ray sensor according to a third embodiment of the present invention. While the load control circuit 101 having the triac TRC is connected between the connecting terminals t1 and t2 through the primary winding of the current transformer CT in the first embodiment, a relay contact ry of a relay RY of a latching type in which a contact state is changed over by energization to, for example, a set coil or a reset coil, and the contact state changed over by magnetic force or the like is held is connected in parallel with a triac TRC in the second embodiment. More specifically, in the automatic gang switch having a heat ray sensor according to the second embodiment, a parallel circuit of the triac TRC and the relay contact ry is connected between connecting terminals t1 and t2 through a primary winding of a current transformer CT. A Zener diode ZD2 is connected in anti-series between a resistor R6 of an on-time power circuit 106 and a diode D4, and a capacitor C4 is connected between a cathode of the Zener diode ZD2 and a ground of the circuit. The relay driving circuit 114 described in the second embodiment is connected in parallel with the capacitor C4, and a voltage applied to both ends of the capacitor C4 is input to an input terminal IN9 of a control IC 103. Because the structures other than the load control circuit 101, the relay driving circuit 114 and the on-time power circuit 106 are the same as those in the first or second embodiment, the like components have the like reference numerals and their description is omitted here.

The operation of the automatic gang switch having a heat ray sensor is described below with reference to a time chart shown in FIG. 34. If the detection signal of the brightness sensor 108 has the H level, that is, the brightness around it is greater than a predetermined threshold, the control IC 103 does not output a control signal to the relay driving circuit 114 even if a human body detection signal is input from a human body detecting sensor 107.

On the other hand, in the case where the output signal of the brightness sensor 108 is set to the L level, that is, the brightness around it is smaller than the predetermined threshold, the control IC 103 outputs a control signal for operating the driving circuit 102 is output from an output terminal OUT1 to the driving circuit 102 when the human body detection signal is input from the human body detecting sensor 107. In the driving circuit 102, a thyristor SCR is turned on in response to the control signal input from the control IC 103, a trigger current flows to a gate of a triac TRC, the triac TRC is turned on, and power is supplied to the load L. The control IC 103 monitors the voltage on both ends of the capacitor C4 input to an input terminal IN9. When the capacitor C4 is charged to a predetermined voltage, a signal for turning on the transistor Q3 is output from an output terminal OUT1a. At this time, a current flows to a set coil S of the relay RY through the transistor Q3, the relay contact ry is turned on, and power is supplied to a load L through the parallel circuit of the relay contact ry and the triac TRC.

The control IC 103 outputs a control signal to the driving circuit 102 based on the human body detection signal input from the human body detecting sensor 107. At the same time, in the case where the human body detection signal is input from the human body detecting sensor 107 within a predetermined operation holding time T1, the operation holding time T1 is reset. Consequently, the output time of the control signal, that is, the operation time of the load L is extended. When the time limit of the operation holding time T1 is over, the control IC 103 outputs a control signal for turning on a transistor Q4 from an output terminal OUT1b. At this time, a current flows to a reset coil R of the relay RY through the transistor Q4, and the relay contact ry is turned off. Then, the control IC 103 stops the output of the control signal from the output terminal OUT1 to the driving circuit 102, the thyristor SCR is not triggered, and the trigger current does not flow to the gate of the triac TRC. Consequently, the triac TRC is turned off and the power supply to the load L is stopped.

As described above, the power is supplied to the load L through the parallel circuit of the relay contact ry and the triac TRC during the operation of the road L. Therefore, the current flowing to the triac TRC can be further reduced, compared with the case in which the load control circuit 101 is constituted by only the triac TRC. Consequently, the heat generation of the triac TRC can be suppressed. Moreover, because the relay contact ry is turned on after the triac TRC has been energized, no rush current flows through the relay contact ry. Accordingly, a load L such, for example, as an inverter-controlled light fixture through which a large rush current flows can be constituted by a small-sized relay RY.

In the present circuit, because a voltage obtained by adding the Zener voltage of the Zener diode ZD2 to the voltage-on both ends of the capacitor C4 is applied between both ends of the relay driving circuit 114, it is possible to drive the relay RY at a higher voltage than the output voltage of a voltage converting circuit 105.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. An automatic gang switch having a heat ray sensor and fixedly mounted on a mounting frame that has a generally rectangular opening defined therein and is secured to a substantially vertical wall, said automatic gang switch comprising:

a housing having a body and a cover and also having a generally rectangular front portion and a mounting means for mounting said housing on the mounting frame, a length of said housing being approximately two thirds of that of the generally rectangular opening of the mounting frame and a width of said housing being approximately equal to that of the generally rectangular opening of the mounting frame;

a human body detecting section accommodated in said housing for detecting heat rays emitted from a human body;

a circuit section accommodated in said housing and comprising:
a control circuit for generating a control signal to turn a load on for a predetermined operation holding time when said human body detecting section generates a detection signal;
a load control circuit connected to a power source and the load in series via two connecting terminals for turning on or off power supply to the load depending on the control signal;
an off-time power circuit connected in parallel with said load control circuit and having an input impedance with which the load is not driven when said load control circuit is off, said off-time power circuit supplying an electric power to said control circuit when said load control circuit is off; and
an on-time power circuit for supplying the electric power to said control circuit when said load control circuit is on;

a time setting section for setting an operation holding time; and a mode setting section for changing over an operation mode of said control circuit to one of an automatic mode in which the load is automatically turned on or off depending on the detection signal from said human body detecting section, a continuous ON mode in which the load is kept on irrespective of the detection signal, and a continuous OFF mode in which the load is kept off irrespective of the detection signal, wherein said human body detecting section, said time setting section, and said mode setting section are disposed on the front portion of said housing which is exposed from the generally rectangular opening of the mounting frame.

2. The automatic gang switch according to claim 1, wherein said time setting section, said mode setting section, and said human body detecting section are positioned in this order from above.

3. The automatic gang switch according to claim 1, further comprising a lens mounted on the front portion of said housing for collecting the heat rays from a predetermined detection region on said human body detecting section, and a detection region limiting cover slidably mounted on the front portion of said housing for limiting the detection region.

4. The automatic gang switch according to claim 3, further comprising first and second cover support members each having an arcuated cross-section, wherein said detection region limiting cover has an arcuated cross-section and is interposed between said first and second cover support members, and wherein said detection region limiting cover has a radius different from a radius of inner peripheral faces of said first cover support members and from a radius of outer peripheral faces of said second cover support members.

5. The automatic gang switch according to claim 3, wherein said detection region limiting cover is disposed above said lens with a clearance therebetween.

6. The automatic gang switch according to claim 3, further comprising first and second cover support members for sandwiching said detection region limiting cover therebetween, wherein said detection area limiting cover has projections formed therewith, and at least one of said first and second cover support members has grooves defined therein for engagement with said projections.

7. The automatic gang switch according to claim 4, wherein said first cover support members each have a stopper formed therewith for maintaining at least a part of the detection region.

8. The automatic gang switch according to claim 3, wherein said detection region limiting cover comprises a plurality of plates.

9. The automatic gang switch according to claim 3, wherein said detection region limiting cover has a flexible portion that expands or contracts according to a position of said detection region limiting cover.

10. The automatic gang switch according to claim 1, further comprising a lens mounted on the front portion of said housing for collecting the heat rays from a predetermined detection region on said human body detecting section, and a lens cover integrally formed with said lens for covering a front face of said lens.

11. The automatic gang switch according to claim 1, further comprising a door pivotally mounted on the front portion of said housing.

12. The automatic gang switch according to claim 11, wherein said door has opposite side walls having respective shafts formed therewith, and said housing has a bearing member for supporting said shafts, and wherein said shafts have an increasing diameter toward said side walls.

13. The automatic gang switch according to claim 11, wherein said door has opposite side walls having respective shafts formed therewith, and said housing has a bearing member for supporting said shafts, and wherein a distance between edges of said side walls and centers of said shafts is greater than a distance between the centers of said shafts and a surface of the front portion of said housing on which said door is mounted.

14. The automatic gang switch according to claim 1, wherein said time setting section changes the operation holding time logarithmically depending on a change over operation thereof.

15. The automatic gang switch according to claim 14, wherein the operation mode of said control circuit can be set to one of the continuous ON mode and the continuous Off mode by the change over operation of said time setting section.

16. The automatic gang switch according to claim 1, further comprising a radiation plate accommodated in said housing and a circuit element thermally coupled to said radiation plate, wherein said housing has a plurality of communication holes defined therein, and said radiation plate has a plurality of through holes defined therein at portions other than those confronting said communication holes.

17. The automatic gang switch according to claim 1, wherein said load control circuit comprises a triac connected between said two connecting terminals.

18. The automatic gang switch according to claim 1, wherein said load control circuit comprises a relay having a relay contact connected between said two connecting terminals.

19. The automatic gang switch according to claim 1, wherein said load control circuit comprises a triac connected between said two connecting terminals and a relay having a relay contact connected in parallel with said triac, and wherein said control circuit turns on said relay contact at a start of power supply to the load under a condition in which said triac is on.

* * * * *

UNITED STATES PATENT AND TRADEMARK OFFICE
CERTIFICATE OF CORRECTION

PATENT NO.    : 6,369,688 B1
DATED         : April 9, 2002
INVENTOR(S)   : Abe et al.

It is certified that error appears in the above-identified patent and that said Letters Patent is hereby corrected as shown below:

<u>Title page,</u>
Item [73], the Assignee's information should read
-- [73]   Assignee:    Matsushita Electric Works, Ltd.,
                      Kadoma-shi, (JP) --

Signed and Sealed this

Fifth Day of November, 2002

*Attest:*

*Attesting Officer*

JAMES E. ROGAN
*Director of the United States Patent and Trademark Office*